(12) United States Patent
Erhart et al.

(10) Patent No.: US 9,666,635 B2
(45) Date of Patent: May 30, 2017

(54) FINGERPRINT SENSING CIRCUIT

(75) Inventors: Richard Alex Erhart, Tempe, AZ (US); Richard Brian Nelson, Chandler, AZ (US); Erik Thompson, Phoenix, AZ (US); Armando Leon Perezselsky, Mesa, AZ (US)

(73) Assignee: Synaptics Incorporated, San Jose, CA (US)

( * ) Notice: Subject to any disclaimer, the term of this patent is extended or adjusted under 35 U.S.C. 154(b) by 444 days.

(21) Appl. No.: 13/031,557

(22) Filed: Feb. 21, 2011

(65) Prior Publication Data

US 2011/0304001 A1    Dec. 15, 2011

Related U.S. Application Data

(60) Provisional application No. 61/306,392, filed on Feb. 19, 2010.

(51) Int. Cl.
*H01L 27/146* (2006.01)
*G06K 9/00* (2006.01)

(52) U.S. Cl.
CPC .... *H01L 27/14678* (2013.01); *G06K 9/00053* (2013.01)

(58) Field of Classification Search
CPC ...................................................... H01L 27/146

(Continued)

(56) References Cited

U.S. PATENT DOCUMENTS

| 4,151,512 A | 4/1979 | Rigannati et al. |
| 4,225,850 A | 9/1980 | Chang et al. |

(Continued)

FOREIGN PATENT DOCUMENTS

| DE | 2213813 A1 | 10/1973 |
| EP | 0929028 A2 | 1/1998 |

(Continued)

OTHER PUBLICATIONS

Matsumoto et al., Impact of Artificial "Gummy" Fingers on Fingerprint Systems, SPIE 4677 (2002), reprinted from cryptome.org.

(Continued)

*Primary Examiner* — Ori Nadav
*Assistant Examiner* — Vernon P Webb
(74) *Attorney, Agent, or Firm* — Leydig, Voit & Mayer, LTD

(57) ABSTRACT

Fingerprint sensing circuit packages and methods of making such packages may comprise a first substrate having a top side and a bottom side; the top side comprising a fingerprint image sensing side over which a user's fingerprint is swiped; the bottom side comprising a metal layer forming a fingerprint sensing circuit image sensor structure; and a sensor control circuit housed in a sensor control circuit package mounted on the metal layer. The sensor control circuit may comprise an integrated circuit die contained within the sensor control circuit package. The fingerprint sensing circuit package may also have a second substrate attached to the bottom side of the first substrate having a second substrate bottom side on which is placed connector members connecting the fingerprint sensing circuit package to a device using a fingerprint image generated from the fingerprint sensing circuitry contained in the fingerprint sensing circuitry package.

16 Claims, 12 Drawing Sheets

(58) Field of Classification Search
USPC .......................................... 257/433, E27.13
See application file for complete search history.

(56) References Cited

U.S. PATENT DOCUMENTS

| | | |
|---|---|---|
| 4,310,827 A | 1/1982 | Asi |
| 4,353,056 A | 10/1982 | Tsikos |
| 4,405,829 A | 9/1983 | Rivest et al. |
| 4,525,859 A | 6/1985 | Bowles et al. |
| 4,550,221 A | 10/1985 | Mabusth |
| 4,580,790 A | 4/1986 | Doose |
| 4,582,985 A | 4/1986 | Lofberg |
| 4,675,544 A | 6/1987 | Shrenk |
| 4,758,622 A | 7/1988 | Gosselin |
| 4,817,183 A | 3/1989 | Sparrow |
| 5,076,566 A | 12/1991 | Kriegel |
| 5,109,427 A | 4/1992 | Yang |
| 5,140,642 A | 8/1992 | Hau et al. |
| 5,305,017 A | 4/1994 | Gerpheide |
| 5,319,323 A | 6/1994 | Fong |
| 5,325,442 A | 6/1994 | Knapp |
| 5,359,243 A | 10/1994 | Norman |
| 5,420,936 A | 5/1995 | Fitzpatrick et al. |
| 5,422,807 A | 6/1995 | Mitra et al. |
| 5,429,006 A | 7/1995 | Tamori |
| 5,456,256 A | 10/1995 | Schneider et al. |
| 5,543,591 A | 8/1996 | Gillespie et al. |
| 5,569,901 A | 10/1996 | Bridgelall et al. |
| 5,623,552 A | 4/1997 | Lane |
| 5,627,316 A | 5/1997 | De Winter et al. |
| 5,650,842 A | 7/1997 | Maase et al. |
| 5,717,777 A | 2/1998 | Wong et al. |
| 5,781,651 A | 7/1998 | Hsiao et al. |
| 5,801,681 A | 9/1998 | Sayag |
| 5,818,956 A | 10/1998 | Tuli |
| 5,838,306 A | 11/1998 | O'Connor |
| 5,848,176 A | 12/1998 | Harra et al. |
| 5,850,450 A | 12/1998 | Schweitzer et al. |
| 5,852,670 A | 12/1998 | Setlak et al. |
| 5,864,296 A | 1/1999 | Upton |
| 5,887,343 A | 3/1999 | Salatino et al. |
| 5,892,824 A | 4/1999 | Beatson et al. |
| 5,903,225 A | 5/1999 | Schmitt et al. |
| 5,915,757 A | 6/1999 | Tsuyama et al. |
| 5,920,384 A | 7/1999 | Borza |
| 5,920,640 A | 7/1999 | Salatino et al. |
| 5,940,526 A | 8/1999 | Setlak et al. |
| 5,963,679 A | 10/1999 | Setlak |
| 5,995,630 A | 11/1999 | Borza |
| 5,999,637 A | 12/1999 | Toyoda et al. |
| 6,002,815 A | 12/1999 | Immega et al. |
| 6,011,859 A | 1/2000 | Kalnitsky et al. |
| 6,016,355 A | 1/2000 | Dickinson et al. |
| 6,052,475 A | 4/2000 | Upton |
| 6,067,368 A | 5/2000 | Setlak et al. |
| 6,073,343 A | 6/2000 | Petrick et al. |
| 6,076,566 A | 6/2000 | Lowe |
| 6,088,585 A | 7/2000 | Schmitt et al. |
| 6,098,175 A | 8/2000 | Lee |
| 6,118,318 A | 9/2000 | Fifield et al. |
| 6,134,340 A | 10/2000 | Hsu et al. |
| 6,157,722 A | 12/2000 | Lerner et al. |
| 6,161,213 A | 12/2000 | Lofstrom |
| 6,175,407 B1 | 1/2001 | Santor |
| 6,182,076 B1 | 1/2001 | Yu et al. |
| 6,182,892 B1 | 2/2001 | Angelo et al. |
| 6,185,318 B1 | 2/2001 | Jain et al. |
| 6,234,031 B1 | 5/2001 | Suga |
| 6,241,288 B1 | 6/2001 | Bergenek et al. |
| 6,259,108 B1 | 7/2001 | Antonelli et al. |
| 6,289,114 B1 | 9/2001 | Mainguet |
| 6,292,272 B1 | 9/2001 | Okauchi et al. |
| 6,317,508 B1 | 11/2001 | Kramer et al. |
| 6,320,394 B1 | 11/2001 | Tartagni |
| 6,325,285 B1 | 12/2001 | Baratelli |
| 6,327,376 B1 | 12/2001 | Harkin |
| 6,330,345 B1 | 12/2001 | Russo et al. |
| 6,332,193 B1 | 12/2001 | Glass et al. |
| 6,333,989 B1 | 12/2001 | Borza |
| 6,337,919 B1 | 1/2002 | Dunton |
| 6,343,162 B1 | 1/2002 | Saito et al. |
| 6,346,739 B1 | 2/2002 | Lepert et al. |
| 6,347,040 B1 | 2/2002 | Fries et al. |
| 6,357,663 B1 | 3/2002 | Takahashi et al. |
| 6,360,004 B1 | 3/2002 | Akizuki |
| 6,362,633 B1 | 3/2002 | Tartagni |
| 6,392,636 B1 | 5/2002 | Ferrari et al. |
| 6,399,994 B2 | 6/2002 | Shobu |
| 6,400,836 B2 | 6/2002 | Senior |
| 6,408,087 B1 | 6/2002 | Kramer |
| 6,459,804 B2 | 10/2002 | Mainguet |
| 6,473,072 B1 | 10/2002 | Comiskey et al. |
| 6,509,501 B2 | 1/2003 | Eicken et al. |
| 6,525,547 B2 | 2/2003 | Hayes |
| 6,525,932 B1 | 2/2003 | Ohnishi et al. |
| 6,535,622 B1 | 3/2003 | Russo et al. |
| 6,539,101 B1 | 3/2003 | Black |
| 6,580,816 B2 | 6/2003 | Kramer et al. |
| 6,597,289 B2 | 7/2003 | Sabatini |
| 6,628,812 B1 | 9/2003 | Setlak et al. |
| 6,631,201 B1 | 10/2003 | Dickinson et al. |
| 6,643,389 B1 | 11/2003 | Raynal et al. |
| 6,672,174 B2 | 1/2004 | Deconde et al. |
| 6,710,461 B2 | 3/2004 | Chou et al. |
| 6,738,050 B2 | 5/2004 | Comiskey et al. |
| 6,741,729 B2 | 5/2004 | Bjorn et al. |
| 6,757,002 B1 | 6/2004 | Oross et al. |
| 6,766,040 B1 | 7/2004 | Catalano et al. |
| 6,785,407 B1 | 8/2004 | Tschudi et al. |
| 6,799,275 B1 | 9/2004 | Bjorn et al. |
| 6,836,230 B2 | 12/2004 | Le Pailleur et al. |
| 6,838,905 B1 | 1/2005 | Doyle |
| 6,873,356 B1 | 3/2005 | Kanbe et al. |
| 6,886,104 B1 | 4/2005 | McClurg et al. |
| 6,897,002 B2 | 5/2005 | Teraoka et al. |
| 6,898,299 B1 | 5/2005 | Brooks |
| 6,924,496 B2 | 8/2005 | Manansala |
| 6,937,748 B1 | 8/2005 | Schneider et al. |
| 6,941,001 B1 | 9/2005 | Bolle et al. |
| 6,941,810 B2 | 9/2005 | Okada |
| 6,950,540 B2 | 9/2005 | Higuchi |
| 6,959,874 B2 | 11/2005 | Bardwell |
| 6,963,626 B1 | 11/2005 | Shaeffer et al. |
| 6,970,584 B2 | 11/2005 | O'Gorman et al. |
| 6,980,672 B2 | 12/2005 | Saito et al. |
| 6,983,882 B2 | 1/2006 | Cassone |
| 7,013,030 B2 | 3/2006 | Wong et al. |
| 7,020,591 B1 | 3/2006 | Wei et al. |
| 7,030,860 B1 | 4/2006 | Hsu et al. |
| 7,031,670 B2 | 4/2006 | May |
| 7,035,443 B2 | 4/2006 | Wong |
| 7,042,535 B2 | 5/2006 | Katoh et al. |
| 7,043,061 B2 | 5/2006 | Hamid et al. |
| 7,043,644 B2 | 5/2006 | DeBruine |
| 7,046,230 B2 | 5/2006 | Zadesky et al. |
| 7,064,743 B2 | 6/2006 | Nishikawa |
| 7,099,496 B2 | 8/2006 | Benkley |
| 7,110,574 B2 | 9/2006 | Haruki et al. |
| 7,110,577 B1 | 9/2006 | Tschud |
| 7,113,622 B2 | 9/2006 | Hamid |
| 7,126,389 B1 | 10/2006 | McRae et al. |
| 7,129,926 B2 | 10/2006 | Mathiassen et al. |
| 7,136,514 B1 | 11/2006 | Wong |
| 7,146,024 B2 | 12/2006 | Benkley |
| 7,146,026 B2 | 12/2006 | Russon et al. |
| 7,146,029 B2 | 12/2006 | Manansala |
| 7,184,581 B2 | 2/2007 | Johansen et al. |
| 7,190,209 B2 | 3/2007 | Kang et al. |
| 7,190,816 B2 | 3/2007 | Mitsuyu et al. |
| 7,194,392 B2 | 3/2007 | Tuken et al. |
| 7,197,168 B2 | 3/2007 | Russo |
| 7,200,250 B2 | 4/2007 | Chou |
| 7,251,351 B2 | 7/2007 | Mathiassen et al. |
| 7,258,279 B2 | 8/2007 | Schneider et al. |

(56) References Cited

U.S. PATENT DOCUMENTS

| | | |
|---|---|---|
| 7,260,246 B2 | 8/2007 | Fujii |
| 7,263,212 B2 | 8/2007 | Kawabe |
| 7,263,213 B2 | 8/2007 | Rowe |
| 7,289,649 B1 | 10/2007 | Walley et al. |
| 7,290,323 B2 | 11/2007 | Deconde et al. |
| 7,308,121 B2 | 12/2007 | Mathiassen et al. |
| 7,308,122 B2 | 12/2007 | McClurg et al. |
| 7,321,672 B2 | 1/2008 | Sasaki et al. |
| 7,356,169 B2 | 4/2008 | Hamid |
| 7,360,688 B1 | 4/2008 | Harris |
| 7,369,685 B2 | 5/2008 | DeLeon |
| 7,379,569 B2 | 5/2008 | Chikazawa et al. |
| 7,408,135 B2 | 8/2008 | Fujeda |
| 7,409,876 B2 | 8/2008 | Ganapathi et al. |
| 7,412,083 B2 | 8/2008 | Takahashi |
| 7,424,618 B2 | 9/2008 | Roy et al. |
| 7,447,339 B2 | 11/2008 | Mimura et al. |
| 7,447,911 B2 | 11/2008 | Chou et al. |
| 7,460,697 B2 | 12/2008 | Erhart et al. |
| 7,463,756 B2 | 12/2008 | Benkley |
| 7,474,772 B2 | 1/2009 | Russo et al. |
| 7,505,611 B2 | 3/2009 | Fyke |
| 7,505,613 B2 | 3/2009 | Russo |
| 7,565,548 B2 | 7/2009 | Fiske et al. |
| 7,574,022 B2 | 8/2009 | Russo |
| 7,596,832 B2 | 10/2009 | Hsieh et al. |
| 7,599,530 B2 | 10/2009 | Boshra |
| 7,616,787 B2 | 11/2009 | Boshra |
| 7,643,950 B1 | 1/2010 | Getzin et al. |
| 7,646,897 B2 | 1/2010 | Fyke |
| 7,681,232 B2 | 3/2010 | Nordentoft et al. |
| 7,689,013 B2 | 3/2010 | Shinzaki |
| 7,706,581 B2 | 4/2010 | Drews et al. |
| 7,733,697 B2 | 6/2010 | Picca et al. |
| 7,751,601 B2 | 7/2010 | Benkley |
| 7,826,645 B1 | 11/2010 | Cayen |
| 7,843,438 B2 | 11/2010 | Onoda |
| 7,848,798 B2 | 12/2010 | Martinsen et al. |
| 7,899,216 B2 | 3/2011 | Watanabe et al. |
| 7,953,258 B2 | 5/2011 | Dean et al. |
| 8,005,276 B2 | 8/2011 | Dean et al. |
| 8,031,916 B2 | 10/2011 | Abiko et al. |
| 8,063,734 B2 | 11/2011 | Conforti |
| 8,077,935 B2 | 12/2011 | Geoffroy et al. |
| 8,107,212 B2 | 1/2012 | Nelson et al. |
| 8,116,540 B2 | 2/2012 | Dean et al. |
| 8,131,026 B2 | 3/2012 | Benkley et al. |
| 8,165,355 B2 | 4/2012 | Benkley et al. |
| 8,175,345 B2 | 5/2012 | Gardner |
| 8,204,281 B2 | 6/2012 | Satya et al. |
| 8,224,044 B2 | 7/2012 | Benkley |
| 8,229,184 B2 | 7/2012 | Benkley |
| 8,276,816 B2 | 10/2012 | Gardner |
| 8,278,946 B2 | 10/2012 | Thompson |
| 8,290,150 B2 | 10/2012 | Erhart et al. |
| 8,315,444 B2 | 11/2012 | Gardner |
| 8,331,096 B2 | 12/2012 | Garcia |
| 8,358,815 B2 | 1/2013 | Benkley et al. |
| 8,374,407 B2 | 2/2013 | Benkley et al. |
| 8,391,568 B2 | 3/2013 | Satyan |
| 2001/0026636 A1 | 10/2001 | Mainget |
| 2001/0030644 A1 | 10/2001 | Allport |
| 2001/0036299 A1 | 11/2001 | Senior |
| 2001/0043728 A1 | 11/2001 | Kramer et al. |
| 2002/0025062 A1 | 2/2002 | Black |
| 2002/0061125 A1 | 5/2002 | Fujii |
| 2002/0064892 A1 | 5/2002 | Lepert et al. |
| 2002/0067845 A1 | 6/2002 | Griffis |
| 2002/0073046 A1 | 6/2002 | David |
| 2002/0089044 A1 | 7/2002 | Simmons et al. |
| 2002/0089410 A1 | 7/2002 | Janiak et al. |
| 2002/0096731 A1 | 7/2002 | Wu et al. |
| 2002/0122026 A1 | 9/2002 | Bergstrom |
| 2002/0126516 A1 | 9/2002 | Jeon |
| 2002/0130671 A1* | 9/2002 | Pezzani ............... G06K 9/0002 324/662 |
| 2002/0133725 A1 | 9/2002 | Roy et al. |
| 2002/0152048 A1 | 10/2002 | Hayes |
| 2002/0181749 A1 | 12/2002 | Matsumoto et al. |
| 2003/0002717 A1 | 1/2003 | Hamid |
| 2003/0002719 A1 | 1/2003 | Hamid et al. |
| 2003/0021495 A1 | 1/2003 | Cheng |
| 2003/0035570 A1 | 2/2003 | Benkley |
| 2003/0063782 A1 | 4/2003 | Acharya et al. |
| 2003/0068072 A1 | 4/2003 | Hamid |
| 2003/0076301 A1 | 4/2003 | Tsuk et al. |
| 2003/0076303 A1 | 4/2003 | Huppi |
| 2003/0095096 A1 | 5/2003 | Robbin et al. |
| 2003/0095690 A1 | 5/2003 | Su et al. |
| 2003/0102874 A1 | 6/2003 | Lane et al. |
| 2003/0123714 A1 | 7/2003 | O'Gorman et al. |
| 2003/0123715 A1 | 7/2003 | Uchida |
| 2003/0141959 A1 | 7/2003 | Keogh et al. |
| 2003/0147015 A1 | 8/2003 | Katoh et al. |
| 2003/0161510 A1 | 8/2003 | Fujii |
| 2003/0161512 A1 | 8/2003 | Mathiassen |
| 2003/0169228 A1 | 9/2003 | Mathiassen et al. |
| 2003/0174871 A1 | 9/2003 | Yoshioka et al. |
| 2003/0186157 A1 | 10/2003 | Teraoka et al. |
| 2003/0209293 A1 | 11/2003 | Sako et al. |
| 2003/0224553 A1 | 12/2003 | Manansala |
| 2004/0012773 A1 | 1/2004 | Puttkammer |
| 2004/0017934 A1 | 1/2004 | Kocher et al. |
| 2004/0022001 A1 | 2/2004 | Chu et al. |
| 2004/0042642 A1 | 3/2004 | Bolle et al. |
| 2004/0050930 A1 | 3/2004 | Rowe |
| 2004/0066613 A1 | 4/2004 | Leitao |
| 2004/0076313 A1 | 4/2004 | Bronstein et al. |
| 2004/0081339 A1 | 4/2004 | Benkley |
| 2004/0096086 A1 | 5/2004 | Miyasaka |
| 2004/0113956 A1 | 6/2004 | Bellwood et al. |
| 2004/0120400 A1 | 6/2004 | Linzer |
| 2004/0125993 A1 | 7/2004 | Zhao et al. |
| 2004/0129787 A1 | 7/2004 | Saito |
| 2004/0136612 A1 | 7/2004 | Meister et al. |
| 2004/0155752 A1 | 8/2004 | Radke |
| 2004/0172339 A1 | 9/2004 | Snelgrove et al. |
| 2004/0179718 A1 | 9/2004 | Chou |
| 2004/0184641 A1 | 9/2004 | Nagasaka et al. |
| 2004/0188838 A1 | 9/2004 | Okada et al. |
| 2004/0190761 A1 | 9/2004 | Lee |
| 2004/0208346 A1 | 10/2004 | Baharav et al. |
| 2004/0208347 A1 | 10/2004 | Baharav et al. |
| 2004/0208348 A1 | 10/2004 | Baharav et al. |
| 2004/0213441 A1 | 10/2004 | Tschudi |
| 2004/0215689 A1 | 10/2004 | Dooley et al. |
| 2004/0228505 A1 | 11/2004 | Sugimoto |
| 2004/0228508 A1 | 11/2004 | Shigeta |
| 2004/0240712 A1 | 12/2004 | Rowe et al. |
| 2004/0252867 A1 | 12/2004 | Lan et al. |
| 2005/0031174 A1 | 2/2005 | Ryhanen et al. |
| 2005/0036665 A1 | 2/2005 | Higuchi |
| 2005/0047485 A1 | 3/2005 | Khayrallah et al. |
| 2005/0100196 A1 | 5/2005 | Scott et al. |
| 2005/0100938 A1 | 5/2005 | Hoffmann et al. |
| 2005/0109835 A1 | 5/2005 | Jacoby et al. |
| 2005/0110103 A1 | 5/2005 | Setlak |
| 2005/0111708 A1 | 5/2005 | Chou |
| 2005/0123176 A1 | 6/2005 | Ishil et al. |
| 2005/0129291 A1 | 6/2005 | Boshra |
| 2005/0136200 A1 | 6/2005 | Durell et al. |
| 2005/0139656 A1 | 6/2005 | Arnouse |
| 2005/0139685 A1 | 6/2005 | Kozlay |
| 2005/0162402 A1 | 7/2005 | Watanachote |
| 2005/0169503 A1 | 8/2005 | Howell et al. |
| 2005/0174015 A1 | 8/2005 | Scott et al. |
| 2005/0210271 A1 | 9/2005 | Chou et al. |
| 2005/0219200 A1 | 10/2005 | Weng |
| 2005/0220329 A1 | 10/2005 | Payne et al. |
| 2005/0231213 A1 | 10/2005 | Chou et al. |
| 2005/0238212 A1 | 10/2005 | Du et al. |
| 2005/0244038 A1 | 11/2005 | Benkley |
| 2005/0244039 A1 | 11/2005 | Geoffroy et al. |

(56) References Cited

U.S. PATENT DOCUMENTS

| | | |
|---|---|---|
| 2005/0247559 A1 | 11/2005 | Frey et al. |
| 2005/0249386 A1 | 11/2005 | Juh |
| 2005/0258952 A1 | 11/2005 | Utter et al. |
| 2005/0269402 A1 | 12/2005 | Spitzer et al. |
| 2006/0006224 A1 | 1/2006 | Modi |
| 2006/0055500 A1 | 3/2006 | Burke et al. |
| 2006/0066572 A1 | 3/2006 | Yumoto et al. |
| 2006/0078176 A1 | 4/2006 | Abiko et al. |
| 2006/0083411 A1* | 4/2006 | Benkley, III ............... 382/124 |
| 2006/0110537 A1 | 5/2006 | Huang et al. |
| 2006/0140461 A1 | 6/2006 | Kim et al. |
| 2006/0144953 A1 | 7/2006 | Takao |
| 2006/0170528 A1 | 8/2006 | Funushige et al. |
| 2006/0181521 A1 | 8/2006 | Perrault et al. |
| 2006/0182319 A1 | 8/2006 | Setlank et al. |
| 2006/0187200 A1 | 8/2006 | Martin |
| 2006/0210082 A1 | 9/2006 | Devadas et al. |
| 2006/0214512 A1 | 9/2006 | Iwata |
| 2006/0214767 A1 | 9/2006 | Carrieri |
| 2006/0239514 A1 | 10/2006 | Watanabe et al. |
| 2006/0249008 A1 | 11/2006 | Luther |
| 2006/0259873 A1 | 11/2006 | Mister |
| 2006/0261174 A1 | 11/2006 | Zellner et al. |
| 2006/0267125 A1 | 11/2006 | Huang et al. |
| 2006/0267385 A1 | 11/2006 | Steenwyk et al. |
| 2006/0271793 A1 | 11/2006 | Devadas et al. |
| 2006/0285728 A1 | 12/2006 | Leung et al. |
| 2006/0287963 A1 | 12/2006 | Steeves et al. |
| 2007/0031011 A1 | 2/2007 | Erhart et al. |
| 2007/0036400 A1 | 2/2007 | Watanabe et al. |
| 2007/0057763 A1 | 3/2007 | Blattner et al. |
| 2007/0058843 A1 | 3/2007 | Theis et al. |
| 2007/0067828 A1 | 3/2007 | Bychkov |
| 2007/0076926 A1 | 4/2007 | Schneider et al. |
| 2007/0076951 A1 | 4/2007 | Tanaka et al. |
| 2007/0086634 A1 | 4/2007 | Setlak et al. |
| 2007/0090312 A1 | 4/2007 | Stallinga et al. |
| 2007/0138299 A1 | 6/2007 | Mitra |
| 2007/0154072 A1 | 7/2007 | Taraba et al. |
| 2007/0160269 A1 | 7/2007 | Kuo |
| 2007/0180261 A1 | 8/2007 | Akkermans et al. |
| 2007/0196002 A1 | 8/2007 | Choi et al. |
| 2007/0198141 A1 | 8/2007 | Moore |
| 2007/0198435 A1 | 8/2007 | Siegal et al. |
| 2007/0228154 A1 | 10/2007 | Tran |
| 2007/0237366 A1 | 10/2007 | Maletsky |
| 2007/0237368 A1 | 10/2007 | Bjorn et al. |
| 2007/0248249 A1 | 10/2007 | Stoianov |
| 2007/0290124 A1 | 12/2007 | Neil et al. |
| 2008/0002867 A1 | 1/2008 | Mathiassen et al. |
| 2008/0013805 A1 | 1/2008 | Sengupta et al. |
| 2008/0019578 A1 | 1/2008 | Saito et al. |
| 2008/0049987 A1 | 2/2008 | Champagne et al. |
| 2008/0049989 A1 | 2/2008 | Iseri et al. |
| 2008/0054875 A1* | 3/2008 | Saito ............................ 324/71.5 |
| 2008/0063245 A1 | 3/2008 | Benkley et al. |
| 2008/0069412 A1 | 3/2008 | Champagne et al. |
| 2008/0126260 A1 | 5/2008 | Cox et al. |
| 2008/0169345 A1 | 7/2008 | Keane et al. |
| 2008/0170695 A1 | 7/2008 | Adler et al. |
| 2008/0175450 A1 | 7/2008 | Scott et al. |
| 2008/0178008 A1 | 7/2008 | Takahashi et al. |
| 2008/0179112 A1 | 7/2008 | Qin et al. |
| 2008/0185429 A1 | 8/2008 | Saville |
| 2008/0201265 A1 | 8/2008 | Hewton |
| 2008/0205714 A1 | 8/2008 | Benkley et al. |
| 2008/0219521 A1 | 9/2008 | Benkley et al. |
| 2008/0222049 A1 | 9/2008 | Loomis et al. |
| 2008/0223925 A1 | 9/2008 | Saito et al. |
| 2008/0226132 A1 | 9/2008 | Gardne |
| 2008/0240523 A1 | 10/2008 | Benkley et al. |
| 2008/0240537 A1 | 10/2008 | Yang et al. |
| 2008/0244277 A1 | 10/2008 | Orsini et al. |
| 2008/0267462 A1 | 10/2008 | Nelson et al. |
| 2008/0279373 A1 | 11/2008 | Erhart et al. |
| 2008/0317290 A1 | 12/2008 | Tazoe |
| 2009/0001999 A1 | 1/2009 | Douglas |
| 2009/0130369 A1 | 5/2009 | Huang et al. |
| 2009/0153297 A1 | 6/2009 | Gardner |
| 2009/0154779 A1 | 6/2009 | Satyan et al. |
| 2009/0155456 A1 | 6/2009 | Benkley et al. |
| 2009/0169071 A1 | 7/2009 | Bond et al. |
| 2009/0174974 A1 | 7/2009 | Huang et al. |
| 2009/0212902 A1 | 8/2009 | Haddock |
| 2009/0218698 A1 | 9/2009 | Lam |
| 2009/0237135 A1 | 9/2009 | Ramaraju et al. |
| 2009/0252384 A1 | 10/2009 | Dean et al. |
| 2009/0252385 A1 | 10/2009 | Dean et al. |
| 2009/0252386 A1 | 10/2009 | Dean et al. |
| 2009/0279742 A1 | 11/2009 | Abiko |
| 2009/0319435 A1 | 12/2009 | Little et al. |
| 2009/0324028 A1 | 12/2009 | Russo |
| 2010/0026451 A1 | 2/2010 | Erhart et al. |
| 2010/0045705 A1 | 2/2010 | Vertegaal et al. |
| 2010/0083000 A1 | 4/2010 | Kesanupalli et al. |
| 2010/0117224 A1* | 5/2010 | McElrea et al. ............... 257/723 |
| 2010/0117794 A1 | 5/2010 | Adams et al. |
| 2010/0119124 A1 | 5/2010 | Satyan |
| 2010/0123675 A1 | 5/2010 | Ippel |
| 2010/0127366 A1 | 5/2010 | Bond et al. |
| 2010/0176823 A1 | 7/2010 | Thompson et al. |
| 2010/0176892 A1 | 7/2010 | Thompson et al. |
| 2010/0177940 A1 | 7/2010 | Thompson et al. |
| 2010/0180136 A1 | 7/2010 | Thompson et al. |
| 2010/0189314 A1 | 7/2010 | Benkley et al. |
| 2010/0208953 A1 | 8/2010 | Gardner et al. |
| 2010/0244166 A1 | 9/2010 | Shibuta et al. |
| 2010/0272329 A1 | 10/2010 | Benkley |
| 2010/0284565 A1 | 11/2010 | Benkley et al. |
| 2011/0002461 A1 | 1/2011 | Erhart et al. |
| 2011/0018556 A1 | 1/2011 | Le et al. |
| 2011/0083018 A1 | 4/2011 | Kesanupalli et al. |
| 2011/0083170 A1 | 4/2011 | Kesanupalli et al. |
| 2011/0090047 A1 | 4/2011 | Patel |
| 2011/0102567 A1 | 5/2011 | Erhart |
| 2011/0102569 A1 | 5/2011 | Erhart |
| 2011/0175703 A1 | 7/2011 | Benkley |
| 2011/0176037 A1 | 7/2011 | Benkley |
| 2011/0182486 A1 | 7/2011 | Valfridsson et al. |
| 2011/0214924 A1* | 9/2011 | Perezselsky et al. ...... 178/18.03 |
| 2011/0267298 A1 | 11/2011 | Erhart et al. |
| 2011/0298711 A1 | 12/2011 | Dean et al. |
| 2012/0044639 A1 | 2/2012 | Garcia |
| 2012/0189166 A1 | 7/2012 | Russo |
| 2012/0189172 A1 | 7/2012 | Russo |
| 2012/0206586 A1 | 8/2012 | Gardner |
| 2012/0256280 A1 | 10/2012 | Ehart |
| 2012/0257032 A1 | 10/2012 | Benkley |
| 2012/0308092 A1 | 12/2012 | Benkley et al. |
| 2013/0021044 A1 | 1/2013 | Thompson et al. |
| 2013/0094715 A1 | 4/2013 | Benkley et al. |

FOREIGN PATENT DOCUMENTS

| | | |
|---|---|---|
| EP | 0905646 A1 | 3/1999 |
| EP | 0973123 A1 | 1/2000 |
| EP | 1018697 A2 | 7/2000 |
| EP | 1139301 A2 | 10/2001 |
| EP | 1531419 A2 | 5/2005 |
| EP | 1533759 A1 | 5/2005 |
| EP | 1538548 A2 | 6/2005 |
| EP | 1624399 B1 | 2/2006 |
| EP | 1775674 A1 | 4/2007 |
| EP | 1939788 A1 | 7/2008 |
| GB | 2331613 A | 5/1999 |
| GB | 2480919 | 12/2011 |
| GB | 2487661 A1 | 8/2012 |
| GB | 2489100 A | 9/2012 |
| GB | 2490192 | 10/2012 |
| GB | 2474999 B | 2/2013 |
| JP | 01094418 A2 | 4/1989 |
| JP | 04158434 A2 | 6/1992 |

(56) References Cited

FOREIGN PATENT DOCUMENTS

| | | |
|---|---|---|
| JP | 2005011002 A | 1/2005 |
| JP | 2005242856 | 9/2005 |
| JP | 2007305097 A | 11/2007 |
| TW | 200606745 A | 2/2006 |
| TW | 200606746 | 2/2006 |
| TW | 200614092 | 5/2006 |
| TW | 200617798 | 6/2006 |
| TW | 200620140 A | 6/2006 |
| TW | 200629167 A | 8/2006 |
| WO | WO 90/03620 A1 | 4/1990 |
| WO | WO 98/58342 A1 | 12/1998 |
| WO | WO 99/28701 A1 | 6/1999 |
| WO | WO 99/43258 A1 | 9/1999 |
| WO | WO 01/22349 A1 | 3/2001 |
| WO | WO 01/94902 | 12/2001 |
| WO | WO 01/94902 A3 | 12/2001 |
| WO | WO 01/95304 A1 | 12/2001 |
| WO | WO 02/11066 A1 | 2/2002 |
| WO | WO 02/47018 A2 | 6/2002 |
| WO | WO 02/061668 A1 | 8/2002 |
| WO | WO 02/077907 A1 | 10/2002 |
| WO | WO 03/063054 A2 | 7/2003 |
| WO | WO 03/075210 | 9/2003 |
| WO | WO 2004/066194 A1 | 8/2004 |
| WO | WO 2004/066693 A1 | 8/2004 |
| WO | WO 2005/104012 A1 | 11/2005 |
| WO | WO 2005/106774 A2 | 11/2005 |
| WO | WO 2006/040724 A1 | 4/2006 |
| WO | WO 2006/041780 A1 | 4/2006 |
| WO | WO 2005/106774 A3 | 6/2006 |
| WO | WO 2007/011607 A1 | 1/2007 |
| WO | WO 2008/033264 A2 | 3/2008 |
| WO | WO 2008/033264 A3 | 3/2008 |
| WO | WO 2008/033265 A2 | 6/2008 |
| WO | WO 2008/033265 A3 | 6/2008 |
| WO | WO 2008/137287 A1 | 11/2008 |
| WO | WO 2009/002599 A2 | 12/2008 |
| WO | WO 2009/002599 A3 | 12/2008 |
| WO | WO 2009/029257 A1 | 6/2009 |
| WO | WO 2009/079219 A1 | 6/2009 |
| WO | WO 2009/079221 A2 | 6/2009 |
| WO | WO 2009/079262 A1 | 6/2009 |
| WO | WO 2010/034036 A1 | 3/2010 |
| WO | WO 2010/036445 A1 | 4/2010 |
| WO | WO 2010/143597 A1 | 12/2010 |
| WO | WO 2011/088248 A1 | 1/2011 |
| WO | WO/2011/088252 A1 | 1/2011 |
| WO | WO 2011/053797 A1 | 5/2011 |

OTHER PUBLICATIONS

Ratha, et al. "Adaptive Flow Orientation Based Feature Extraction in Fingerprint Images," Pattern Recognition, vol. 28 No. 11, 1657-1672, Nov. 1995.

Ratha, et al., "A Real Time Matching System for Large Fingerprint Databases," IEEE, Aug. 1996.

Suh, et al., "Design and Implementation of the AEGIS Single-Chip Secure Processor Using Physical Random Functions", Computer Architecture, 2005, ISCA '05, Proceedings, 32nd International Symposium, Jun. 2005 (MIT Technical Report CSAIL CSG-TR-843, 2004.

Rivest, et al., "A Method for Obtaining Digital Signatures and Public-Key Cryptosystems", Communication of the ACM, vol. 21 (2), pp. 120-126. (1978).

Hiltgen, et al., "Secure Internet Banking Authentication", IEEE Security and Privacy, IEEE Computer Society, New York, NY, US, Mar. 1, 2006, pp. 24-31, XP007908655, ISSN: 1540-7993.

Hegt, "Analysis of Current and Future Phishing Attacks on Internet Banking Services", Mater Thesis. Techische Universiteit Eindhoven—Department of Mathematics and Computer Science May 31, 2008, pp. 1-149, XP002630374, Retrieved from the Internet: URL:http://alexandria.tue.nl/extral/afstversl/wsk-i/hgt2008.pdf [retrieved on Mar. 29, 2011] *pp. 127-134, paragraph 6.2*.

Gassend, et al., "Controlled Physical Random Functions", In Proceedings of the 18th Annual Computer Security Conference, Las Vegas, Nevada, Dec. 12, 2002.

Bellagiodesigns.com (Internet Archive Wayback Machine, www.bellagiodesigns.com date: Oct. 29, 2005).

Davide Maltoni, "Handbook of Fingerprint Recognition", XP002355942 Springer, New York, USA, Jun. 2003 pp. 65-69.

Vermasan, et al., "A500 dpi AC Capacitive Hybrid Flip-Chip CMOS ASIC/Sensor Module for Fingerprint, Navigation, and Pointer Detection With On-Chip Data Processing", IEEE Journal of Solid State Circuits, vol. 38, No. 12, Dec. 2003, pp. 2288-2294.

Wikipedia (Mar. 2003). "Integrated Circuit," http://en.wikipedia.org/wiki/integrated_circuit. Revision as of Mar. 23, 2003.

Wikipedia (Dec. 2006). "Integrated circuit" Revision as of Dec. 10, 2006. http://en.widipedia.org/wiki/Integrated_circuit.

Closed Loop Systems, The Free Dictionary, http://www.thefreedictionary.com/closed-loop+system (downloaded Dec. 1, 2011).

Feedback: Electronic Engineering, Wikipedia, p. 5 http://en.wikipedia.org/wiki/Feedback#Electronic_engineering (downloaded Dec. 1, 2011).

Galy et al. (Jul. 2007) "A full fingerprint verification system for a single-line sweep sensor." IEEE Sensors J., vol. 7 No. 7, pp. 1054-1065.

* cited by examiner

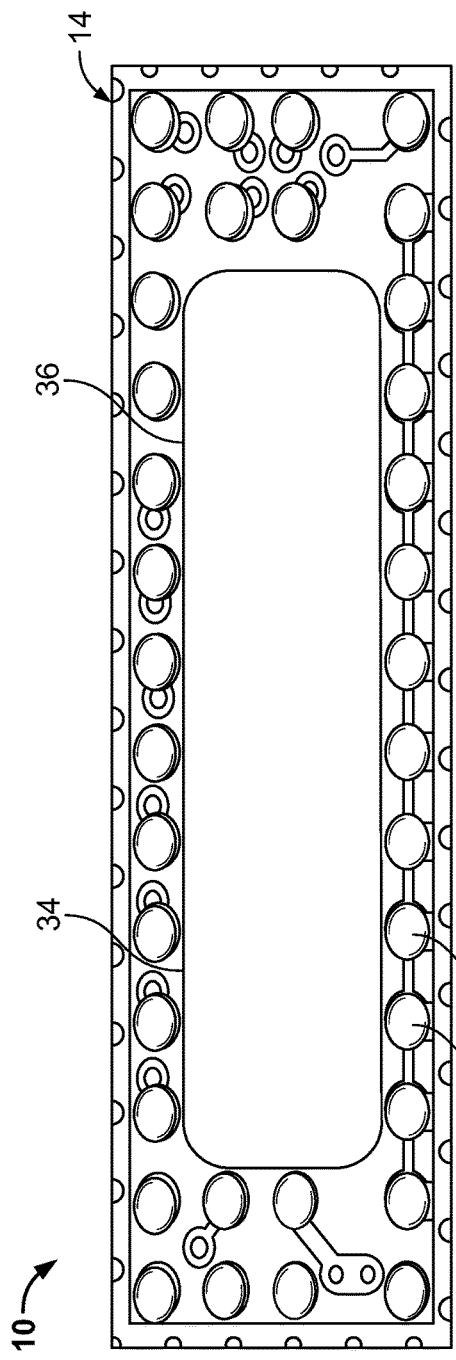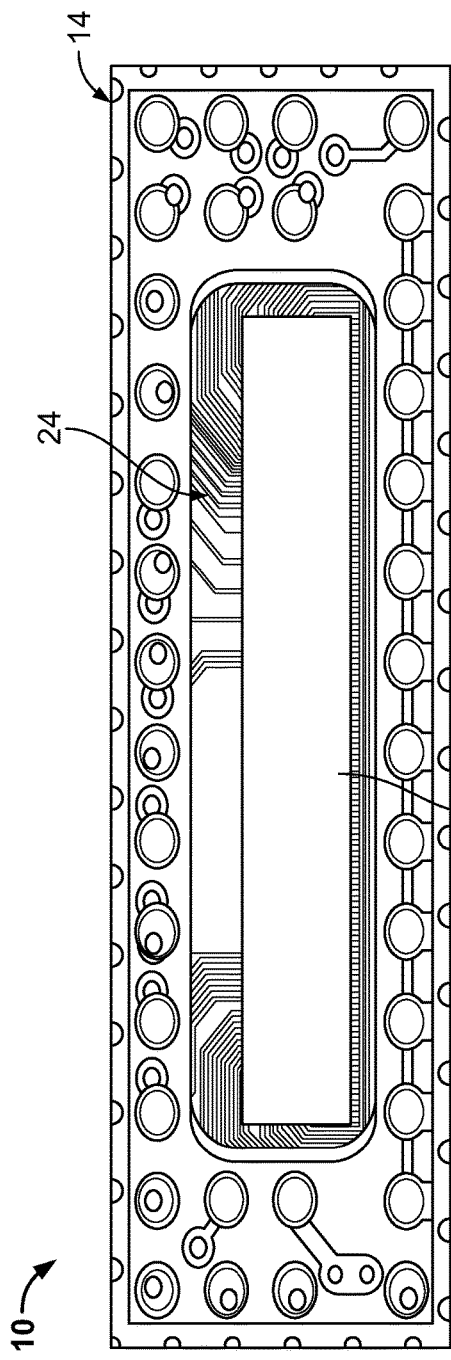

FINGERPRINT SENSING CIRCUIT

CROSS-REFERENCE

This application claims the benefit of U.S. Provisional Application No. 61/306,392, filed Feb. 19, 2010, entitled "Fingerprint Sensing Circuit" which application is incorporated herein by reference.

BACKGROUND OF THE INVENTION

Fingerprint sensor circuitry must be protected from physical, mechanical, and electrical damage by barrier materials. The barrier material often determines the cost, size, and overall reliability of the product. All sensor types, including, but not restricted to swipe, static, silicon touch, capacitive, or sensor separated from silicon, require some form of protection over the imaging circuitry which is used to acquire the finger print image.

SUMMARY OF THE INVENTION

Aspects of the disclosure provide for fingerprint sensing circuit packages, methods of use and methods of manufacture.

Some embodiments of the disclosure provide a fingerprint sensing circuit package including at least one substrate with a first top side and a second bottom side. The first top side can be a sensing side for a user's fingerprint to be swiped over. The second side can include fingerprint sensing circuitry such as an image sensor structure, a velocity sensor structure, and a sensor integrated circuit (IC). The top side can be thinned down through the process of back-lapping to enhance the sensing performance of the fingerprint sensing circuitry as well as reduce the package height of the fingerprint sensing circuit package.

Some embodiments of the disclosed subject matter provide a fingerprint sensing circuit including at least one substrate with stud-based packaging or cavity-based packaging. Fingerprint sensing circuitry, such as an image sensor structure, a velocity sensor structure, and a sensor IC can be inverted and formed on or attached to the underside of the substrate. The stud-based packaging can include a polymer filler on the underside of the substrate to protect the fingerprint sensing circuitry. The cavity-based packaging can include a second substrate coupled to the underside of the first substrate to provide a protective cavity around the fingerprint sensing circuitry. The cavity can then be filled with a polymer filler.

Fingerprint sensing circuit packages and methods of making such packages are disclosed which may comprise a first substrate having a top side and a bottom side; the top side comprising a fingerprint image sensing side over which a user's fingerprint is swiped; the bottom side comprising a metal layer forming a fingerprint sensing circuit image sensor structure; and a sensor control circuit housed in a sensor control circuit package mounted on the metal layer. The sensor control circuit may comprise an integrated circuit die contained within the sensor control circuit package.

The fingerprint sensing circuit package may also have a second substrate attached to the bottom side of the first substrate having a second substrate bottom side on which is placed connector members connecting the fingerprint sensing circuit package to a device using a fingerprint image generated from the fingerprint sensing circuitry contained in the fingerprint sensing circuitry package. The second substrate may comprise an opening spaced over the sensor control circuit package and a sensor control circuit protective material may cover the sensor control circuit in the opening. The first substrate can have a thickness determined by back-lapping the first substrate on the top side. The top side of the first substrate can be covered with a protective layer of ink. The fingerprint sensing circuit package may comprise a first substrate having a top side and a bottom side, with the bottom side comprising a metal layer forming a fingerprint sensing circuit image sensor structure and a sensor control circuit housed in a sensor control circuit package may be mounted on the metal layer and covered by a layer of protective material, such as a polymer material, such as pre-preg.

The second substrate attached to the bottom side of the first substrate may have a bottom side of the second substrate on which is placed connector members connecting the package to a device using a fingerprint image generated from the fingerprint sensing circuitry contained in the fingerprint sensing circuitry package may comprising an opening spaced over and surrounding the sensor control circuit package. A sensor control circuit protective material may cover the sensor control circuit in the opening. the top side of the first substrate may be covered with a protective layer of ink.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 4 is a bottom view of a lower substrate of a fingerprint sensing circuit package according to aspects of an embodiment of the disclosed subject matter;

FIG. 5 is the bottom view of the lower substrate of the fingerprint sensing circuit package of FIG. 4, prior to certain final processing steps;

DETAILED DESCRIPTION OF THE INVENTION

Figure 1:
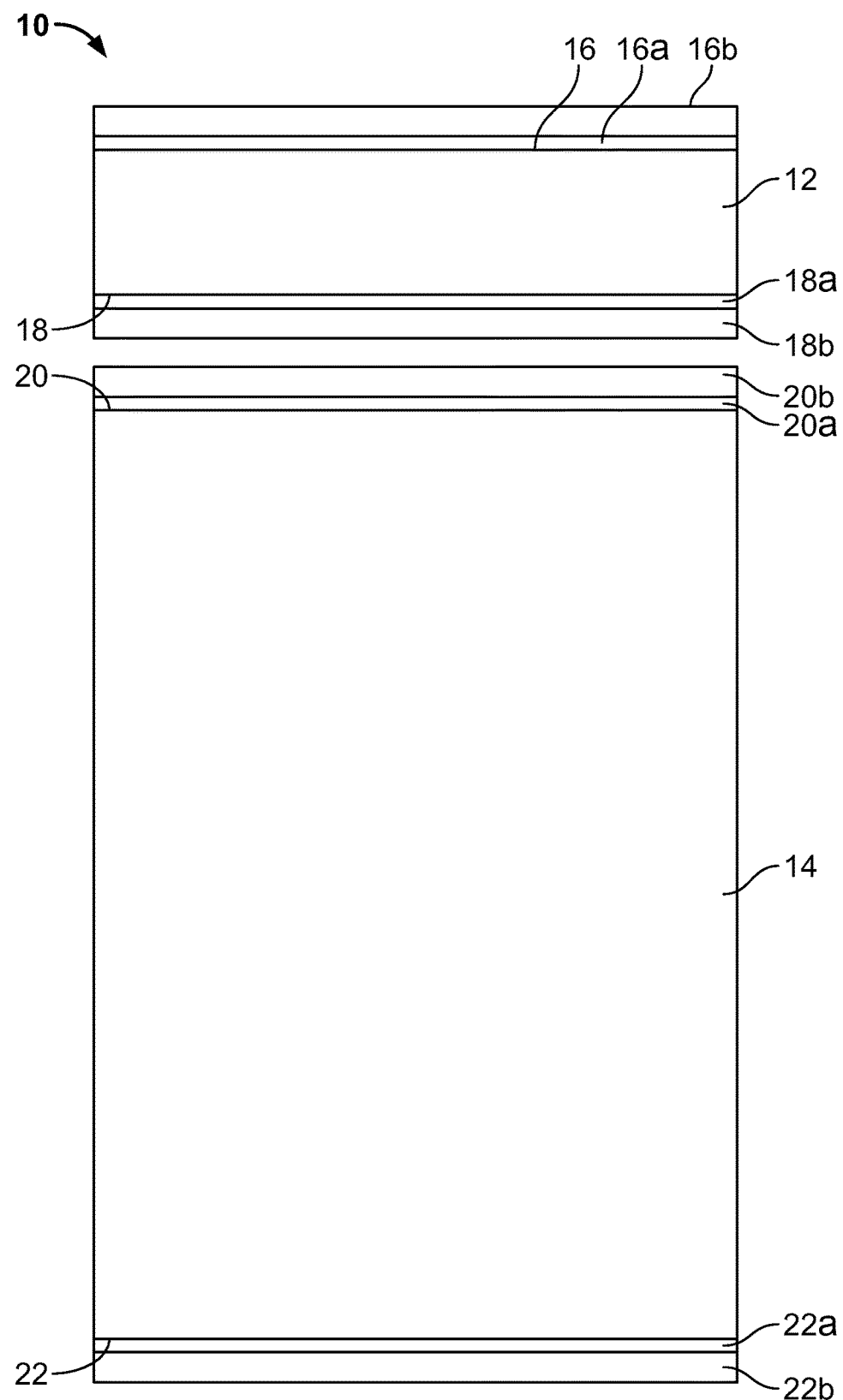
FIG. 1 is a schematic side view of a fingerprint sensing circuit package according to one embodiment of the disclosed subject matter.

FIG. 1 shows a side view of a conventional fingerprint sensing circuit package 10 which can be used in some embodiments of the disclosed subject matter, for use in housing fingerprint image sensing and image reconstruction circuitry as is discussed in more detail in, e.g., U.S. Pat. No. 7,751,601, entitled, FINGER SENSING ASSEMBLIES AND METHODS OF MAKING, issued on Jul. 6, 2010, U.S. Pat. No. 7,460,697, entitled ELECTRONIC FINGERPRINT SENSOR WITH DIFFERENTIAL NOISE CANCELLATION, issued on Dec. 2, 2008, U.S. Pat. No. 7,146,024, entitled SWIPED APERTURE CAPACITIVE FINGERPRINT SENSING SYSTEM AND METHODS, issued on Dec. 5, 2006 and U.S. Pat. No. 7,099,496, entitled SWIPED APERTURE CAPACITIVE FINGERPRINT SENSING SYSTEM AND METHODS, each owned at least in part by the assignee of the present application, the disclosures of each of which are hereby incorporated by reference in their entirety.

The two substrates, an upper substrate 12 and a lower substrate 14, can define four main surfaces of the fingerprint sensing circuit package 10: a first surface 16 can be a top surface 16 of the upper substrate 12; a second surface 18 can be a bottom surface 18 of the upper substrate 12; a third surface 20 can be a top surface 20 of the lower substrate 14; and a fourth surface 22 can be a bottom surface 22 of the lower substrate 14. The top surface 16 of the first substrate 12 may be coated with a metal layer 16a of about 8 μm in thickness and the bottom surface 18 may be covered with a metal layer 18a of about 8 μm in thickness. The metal layers 16a and 18a may be covered in a respective solder resist layer 16b, 18b of a thickness in each case of about 20 μm.

The top surface 20 of the lower substrate 14 may be a coated with a metal layer 20a of about 8 μm in thickness and the bottom surface 22 may be covered with a metal layer 22a of about 8 μm in thickness. The metal layers 20a and 22a may be covered in a respective solder resist layer 20b, 22b of a thickness in each case of about 20 μm. The thickness of the first substrate 12 and the second substrate 14 in FIG. 1, for example, can be about 100 micrometers and about 640 micrometers, respectively, with a total thickness of each, including the coating layers 16a, 16b, 18a, 18b for substrate 12 and 20a, 20b, 22a, 22b, for substrate 14, being, respectively, 156 μm and 696 μm.

As shown in FIG. 1, the fingerprint sensing circuit package 10 can include a two-substrate architecture with a first upper substrate 12 and a second lower substrate 14. It will be understood that the terms "upper" and "lower" are meant to orient the description to the illustration as shown in the FIGS., with "upper" and like terms, such as "top," generally referring to toward the top of the page and "lower" and like terms, such as "bottom," referring generally to towards the bottom of the page, as illustrated. The terms are not meant to limit the elements described to any particular positioning of the sensing circuit package when in use in reference to, e.g., an external coordinate system, such as reference to physical horizontal and vertical coordinates in the physical world. Thus, it will be understood that in actual use, the "top" could face in a variety of directions, including down in the surrounding physical coordinate system, and likewise for "bottom" and like orientationally descriptive terms used herein.

Figure 2:
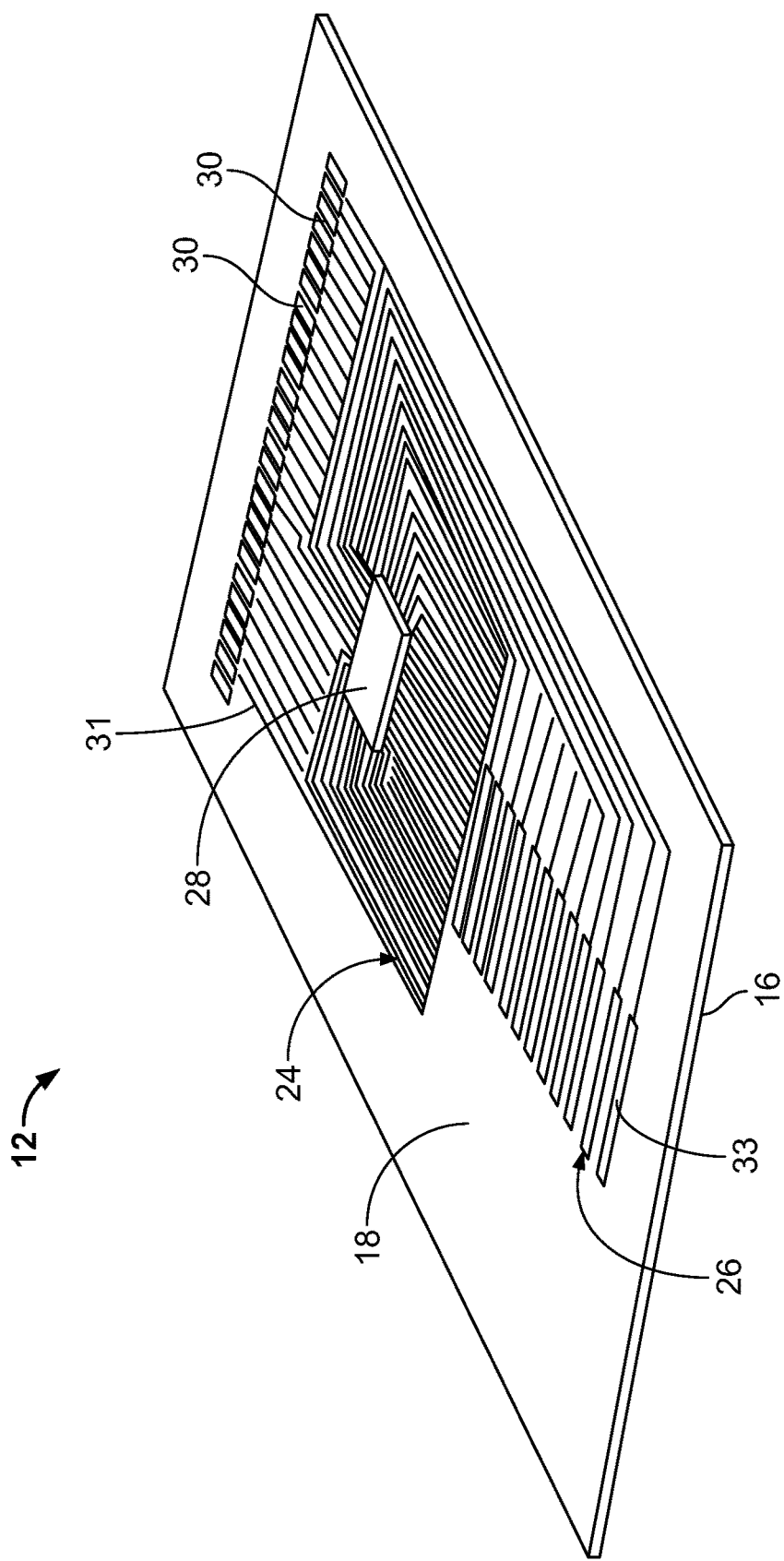
FIG. 2 is a perspective bottom view of an upper substrate of a fingerprint sensing circuit package according to aspects of an embodiment of the disclosed subject matter.
Figure 3:
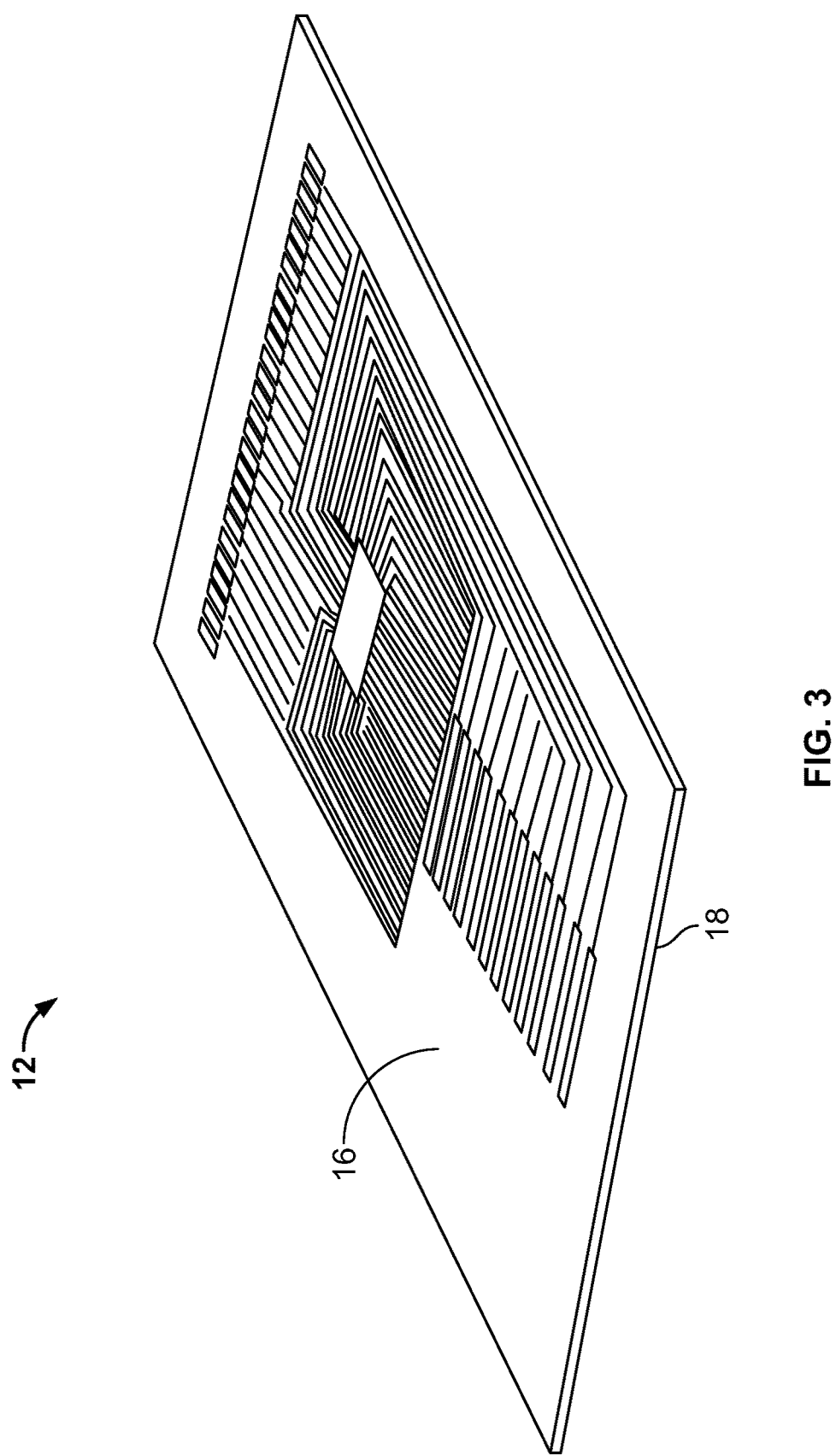
FIG. 3 is a perspective top view of the upper substrate of FIG. 2, according to aspects of an embodiment of the disclosed subject matter.

FIGS. 2 and 3 illustrate the upper substrate 12 according to one embodiment of the disclosed subject matter. The bottom surface 18 can be a circuit side of the upper substrate 12, as shown in FIG. 2. The top surface 16 of the upper substrate can be a sensing side of the upper substrate 12, as shown in FIG. 3. The fingerprint image sensor structure 24 and the fingerprint velocity sensor structure 26 and the IC 28 seen through a transparent upper substrate 12, which may not always be transparent, but is illustrated as such in FIG. 3 for purposes of illustration. The upper substrate 12 can be constructed of a flexible or rigid material suitable for applying a circuit pattern thereon, such as a printed circuit pattern of contacts 30, leads 31, 33, and the like, as is well known in the art. Such a printed circuit pattern, as is explained in more detail below, can form a printed circuit pattern layout of the structures for a fingerprint sensor circuit fingerprint sensor element 24 and/or velocity sensor element 26. These structures 24, 26 may be formed in the metal layer 18a on the bottom surface 18 of the upper substrate 12, as is well known in the art of printed circuit board fabrication. In one embodiment, the upper substrate 12 can be constructed of a flexible polyimide material, such as Kapton®, such as KR4. The polyimide material can provide substantial durability and reliability to the fingerprint sensing circuit package 10.

In some embodiments, the fingerprint sensing circuit package 10 can include a fingerprint image sensor structure 24, having contacts 30 and leads 31, to detect the ridges and valleys of a fingerprint as a finger moves across the image sensor structure 24. The fingerprint sensing circuit package 10 can also include a fingerprint velocity sensor structure 26, having leads 33, to detect the speed of a finger moving across the image sensor 24 structure and velocity sensor structure 26. The image sensor 24 and/or the velocity sensor 26 can be bonded to the bottom surface 18 (i.e., the circuit side of the upper substrate 12). For example, the image sensor 24 and/or the velocity sensor 26 can include conductive traces/leads 31, 33 printed or otherwise applied to the bottom surface 18 of the upper substrate, e.g., using a lithographic etching or other application technique as shown in FIG. 2, as is well known in the art of printed circuit board fabrication. In some embodiments, as is discussed in more detail in one or more of the above noted patents, the image sensor structure 24 can be implemented as an array of capacitive sensors capable of sensing the ridges and valleys of a finger as it travels over the sensor structure 24. In addition, the velocity sensor structure 26 can by implemented using two or more capacitive detectors formed by leads 33 at intervals along the direction of travel of the finger.

Fingerprint information sensed by the image sensor structure 24 and the velocity sensor structure 26 can be transmitted to one or more sensor integrated circuits (ICs) 28 connected, e.g., to the bottom surface 18 of the upper substrate 12. The sensor IC 28 in its IC package can be bonded to the bottom surface 18 using a suitable technique such as a chip-on-flex (COF) process, wirebond, flip chip, anisotropic conductive film (ACF) adhesive, underfill, glob top, etc. The IC 28 package connection contacts (not shown) may be attached by eutectic thermal compression bonding.

The sensor IC 28 can include drive and sense and logic electronic circuits for driving the fingerprint image sensor structure 24 and velocity sensor structure, receiving fingerprint image and velocity information and interpreting the fingerprint image and velocity information received at the sensor integrated circuit 28, respectively from the image sensor structure 24 electrical connections 30, 31 and the velocity sensor 26 structure electrical connections 33. In one embodiment, the sensor IC 28 can be a silicon chip or die.

The sensor IC 28 can receive fingerprint information from the image sensor structure 24 and/or the velocity sensor 26 structure via radiofrequency (RF) signals. For example, as is also discussed in more detail in one or more of the above noted patents, in one embodiment, each conductive trace 31 of the image sensor structure 24 and 33 of the velocity sensor structure 26 can act as an RF transmitter to transmit the RF signal through the respective leads 31 of the fingerprint sensor structure and to transmit fingerprint information from the fingerprint sensor structure 24 to the IC 28. The sensor IC 28 can include one or more RF receivers to receive the fingerprint information from the fingerprint sensor structure 24. Fingerprint velocity information can be similarly be detecting using RF signals generated at the IC 28, transmitted to the velocity sensor structure 26 and received back at the IC 28, all as is further disclosed in the above referenced patents.

During use, a user's finger can be swiped along the sensing side of the upper substrate 12, i.e., over the top surface 16. On the bottom layer 18 of the upper substrate 12, i.e., the sensor circuit side of the upper substrate 12, the image sensor structure 24 and the velocity sensor structure 26 can be used to detect changes in capacitance as the finger is swiped. As a result of having a separate sensing side 16 and sensor circuit side 18, the top substrate 12 can substantially electrically and mechanically isolate the user's finger from the image sensor structure 24, the velocity sensor structure 26, and the sensor IC 28, thereby providing some degree of protection from such as electrostatic discharge (ESD) and mechanical abrasion as the finger swipes over the sensing side 16 of the upper substrate 12.

In some embodiments, the bottom side, i.e., sensor circuit side, of the upper substrate 12 can include interconnect pads 30 that allow, e.g., the sensor IC 28 to interface with the bottom surface 18 of the upper substrate 12, or allow other external electrical connections to the fingerprint image sensing structure 24 and fingerprint velocity sensing structure, such as ground, power, etc. The lower substrate 14 can include, for example, power supply circuitry, external communication circuitry, etc. for the sensor IC 28 and/or the fingerprint image sensor structure 24 and/or the fingerprint velocity sensor structure 26.

FIG. 4 illustrates the lower substrate 14 according to one embodiment of the disclosed subject matter. As shown in FIG. 4, the bottom surface 22 (i.e., the underside of the bottom substrate 14) can include a ball grid array (BGA) with solder balls 32 to electrically connect the fingerprint sensing circuit package 10 to a substrate of a product, i.e., serve as a fingerprint image sensor circuit package 10 mounting arrangement.

In addition, as shown in FIGS. 4 and 5, the lower substrate 14 can include a cavity 34. The cavity 34 can encircle at least a portion of the fingerprint sensing circuitry (e.g., the sensor IC 28 and/or portions of the image sensor structure 24 and the velocity sensor structure 26), as shown in FIG. 5. In some embodiments, the cavity 34 can be filled with a polymer 36 (e.g., epoxy) to add strength and durability to the fingerprint sensing circuit package 10, as shown in FIGS. 4 and 5.

Figure 6:
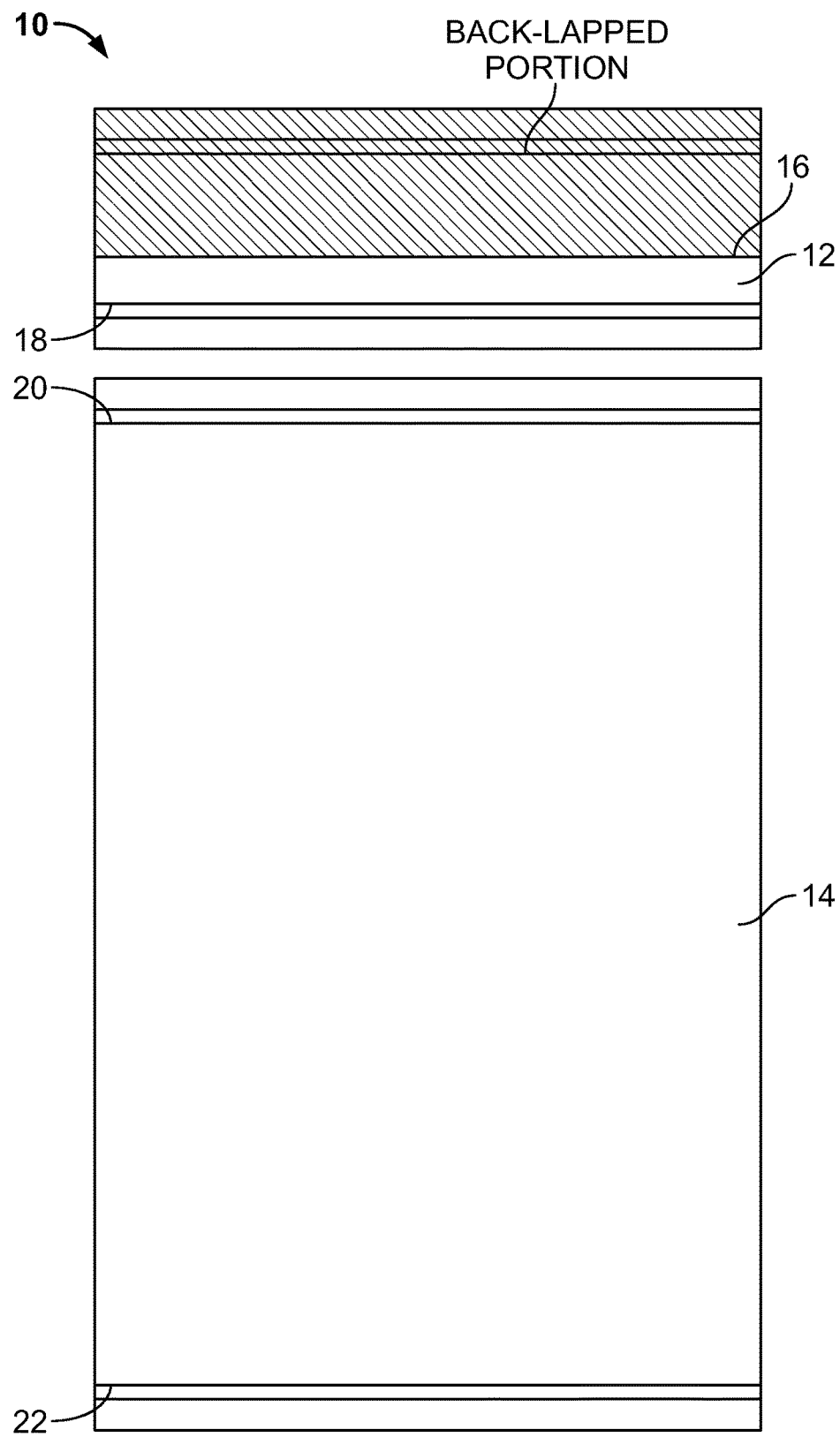
FIG. 6 is a schematic side view of a fingerprint sensing circuit according to another embodiment of the disclosed subject matter.

FIG. 6 illustrates the fingerprint sensing circuit package 10 according to one embodiment of the disclosed subject matter. In the fingerprint sensing circuit package 10 as illustrated in FIG. 6, the upper substrate 12 can have a thickness of about 30 µm. Such a thickness can make it difficult to manufacture the substrate 12 with, for example, the image sensor structure 24, the velocity sensor structure 26, or the circuit connectors 30 and leads 31, 33. In addition, such a thickness can be very fragile, making it difficult to attach to the lower substrate 14.

As a result, the upper substrate 12 can be fabricated at a larger thickness and then, e.g., thinned down to the desired thickness. The upper substrate 12 can be thinned down, for example, through the process of back lapping or etching, to reduce the package height of the fingerprint sensing circuit package 10 as well as to create an optimal thickness between the top surface 16 and the bottom surface 18 for the sensing circuit package 10 upper substrate 12. That is, e.g., in order to enhance sensing performance using the fingerprint image sensor structure 24 and the velocity sensor structure 26. The sensor IC 28 can be attached to the bottom surface 18 either before or after the upper substrate 12 has been lapped to thin the upper substrate 12.

In another embodiment, the fingerprint sensing circuit package 10 can have a single-substrate architecture, including only the upper substrate 12 (i.e., only that between the top surface 16 and the bottom surface 18 of the upper substrate, with appropriate coatings/protective layers as needed). The top surface 16 can be a sensing side of the substrate 12 and the bottom surface 18 can be a sensor circuit containing side, where the substrate 12 can include a sensor IC 28 on the bottom sensor circuit side of the substrate and a user's finger can be swiped along the opposite, top sensing side of the substrate 12.

As the user's finger is swiped along the top sensing side of the substrate 12, the sensor IC 28, with a separate or integral image sensor structure 24 and velocity sensor structure 26, e.g., some or all of each of sensor structure 24 and/or sensor structure 26, within the integrated circuitry of the IC 28, can detect the user's fingerprint through the substrate 12 using techniques such as capacitive, thermal, radio frequency (RF), infrared (IR), light-gathering, and/or ultrasonic techniques. The substrate 12 can also include other circuitry, such as power supply circuitry, external communications circuitry, etc. on the bottom side 18, as well as bonding pad options such as BGA or wirebond. In such embodiments, the top surface 16 can be thinned down, for example, through the process of back lapping, to reduce the package height of the fingerprint sensing circuit package 10 as well as to create an optimal thickness between the top surface 16 and the bottom surface 18 for the sensing circuitry package 10 (e.g., to enhance sensing performance of the sensing circuitry, 24, 26, 28).

Performing processing such as back lapping or etching to thin the substrate 12 can provide a low-cost method of protecting the fingerprint sensor circuitry contained within the sensor circuitry package 10. The substrate 12 can be a standard, inexpensive substrate used as a thin protective coating over the fingerprint image sensor structure 24 and fingerprint velocity sensor structure 26, and the IC 28, forming the packaging for the fingerprint sensor product. In addition, the fingerprint sensing circuit package 10 can be constructed initially using a substrate 12 of standard thickness, thus removing the need to obtain thinner materials which may be offered at higher prices. Following construction, the substrate 12 can then be back lapped to the thinner, desired thickness, as noted above. With the thinned down substrate 12, such that the top sensing surface 16 and bottom sensor circuitry surface 18 are closer together, the fingerprint sensing circuitry housed within the fingerprint sensor circuit package 10 can allow proper functioning of the sensor circuit, including the sensor circuit structure and velocity sensor structure responding to capacitive or other field changes due to the passing of the finger over the sensing side 16 of the upper substrate, while still providing substantial protection from physical and/or electrical damage in a very cost effective manner.

Figure 7:
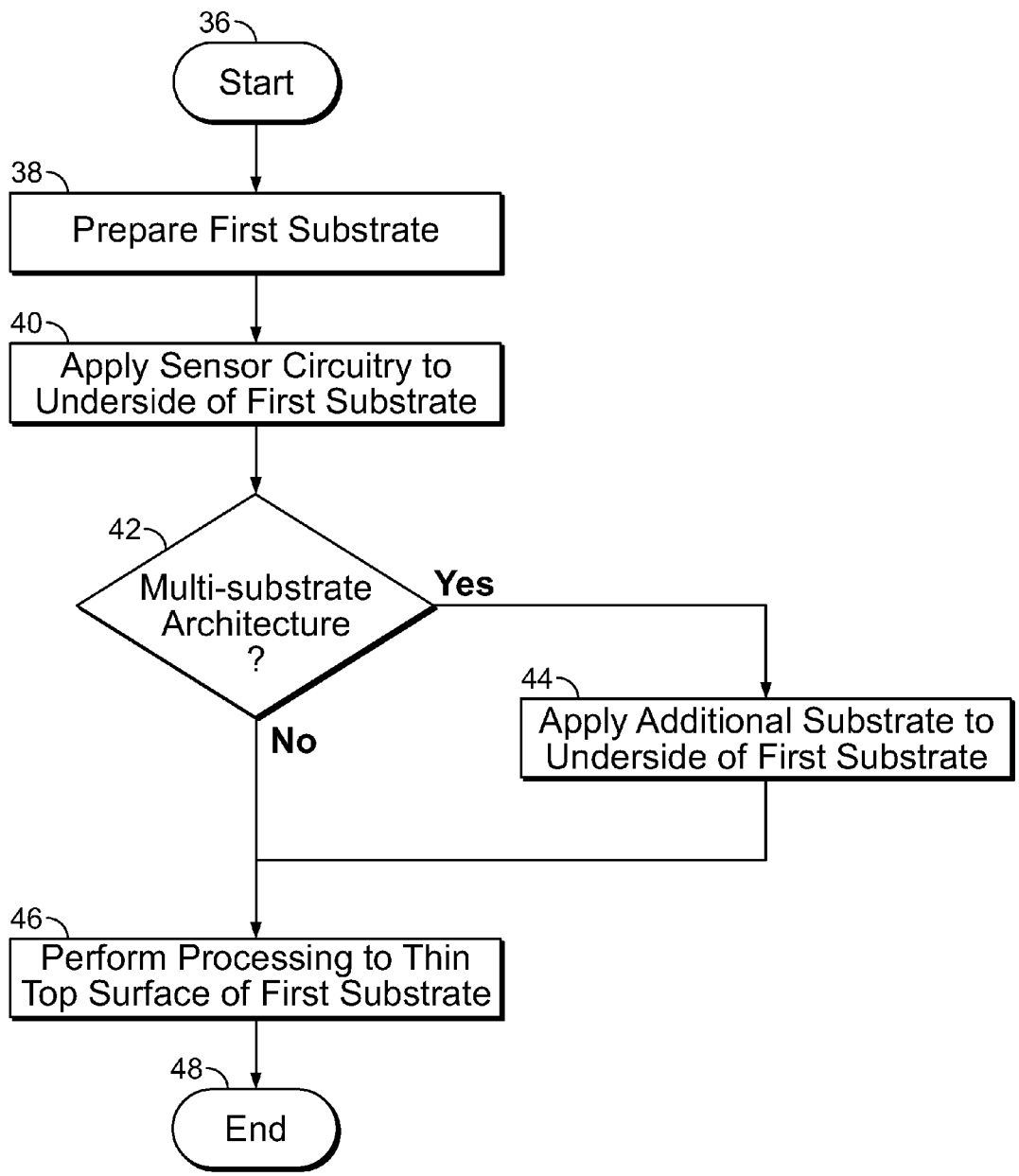
FIG. 7 shows in block diagram for the steps of a process for making a fingerprint sensor circuit package according to aspects of an embodiment of the disclosed subject matter.

FIG. 7 illustrates a fingerprint sensing circuit package 10 construction process according to one embodiment of the disclosed subject matter. After the process is started (at step 36), a first upper first substrate 12 is prepared at step 38. For example, the first upper substrate 12 can be prepared by cutting out an array of first upper substrates 12 or cutting out a single first upper substrate 12. Following step 38, sensor circuitry, such as a sensor circuitry IC 28 and an integral or separate image sensor structure 24 and velocity sensor structure 26 can be applied to an underside (bottom surface) of the upper substrate 12 at step 40. If the fingerprint sensing circuit is to have a multi-substrate architecture (as determined at step 42), one or more additional substrates, such as a second lower substrate 14 can be applied to the bottom surface 18 of the upper substrate 12 at step 44.

If the fingerprint sensing circuit package 10 is to have a single-substrate architecture (as determined at step 42), or following step 44, processing can be performed to thin the upper substrate 12 at step 46. Processing to thin the substrate 12 can include back lapping, etching, etc. Following step 46, the process can be terminated at step 48. In some embodiments, some steps can be performed before others (for example, steps 42 and 44 can be performed before step 40). Also, in some embodiments, additional steps can be performed, such as applying a coating to the thinned-down upper substrate 12, applying a BGA 32 to the bottom surface of the upper substrate 12 or the bottom surface 22 of the lower substrate 14, applying a polymer to the underside of the upper substrate 12 (as described below), etc.

In some embodiments, the fingerprint sensing circuit package 10 can have the single-substrate architecture, as described above. In order for the sensor IC 28 to be bonded to the bottom surface 18 of the single substrate, such as substrate 12, the sensor IC 28 can be inverted adjacent the bottom surface 18 and assembled from the bottom of the fingerprint sensing circuit package 10 substrate 12. In addition, the sensor IC 28 in such embodiments can include the image sensor structure 24 and/or the velocity sensor structure 26 as integral or separate parts, as noted above. Further, the image sensor structure 24 and/or the velocity sensor structure 26, i.e., the connectors, 30, leads 31, 33 forming the sensor structures on the substrate surface 18, when separate from the sensor IC 28, can alternatively be formed on the top layer 16 (i.e., the sensing side) or, as noted above, on the bottom surface 18 (i.e., the sensor circuit side of the substrate 12).

When the fingerprint image sensor structure 24 and/or fingerprint velocity sensor structure 26 is formed on the top surface 16, an ink layer or an epoxy glob-top layer can be applied over the structure(s), 24, 26, as a protective or cosmetic coating. In one embodiment, to increase the durability of the fingerprint sensing circuitry contained in the sensor circuit package 10, as well as protect the sensor circuitry from, such as moisture entering from the bottom of the substrate 12, a protective material, e.g., a polymer 36 can be applied to the bottom surface 18. The polymer 36 can be thick enough to cover the sensing circuitry, but thin enough to allow the BGA 32 to make connections with a substrate (not shown) of another product in which the output of the fingerprint image sensing circuitry is to be used. In some embodiments, conductive "studs" 62 (shown in FIGS. 9B and 10F as discussed below) can be applied, e.g., in the lower substrate 14, e.g., in place of the BGA solder balls 32. The polymer can then be applied to fill around the studs while still allowing electrical connections to be made between the elements formed on or attached to the bottom surface 18 and a product substrate through the studs 62. Filling a polymer around the BGA 32 or studs 62 onto the bottom surface 18 can be considered "stud-based" packaging.

In some embodiments, the fingerprint sensing circuit package 10 can have the two-substrate architecture, as described above, with the sensor IC 28 bonded to the bottom surface 18 of the upper substrate 12. To increase the durability of the fingerprint sensing circuit package 10, as well as protect the sensing circuitry structures 24, 26 from the underside, the cavity 34 created by the lower substrate 14 can be filled with a polymer 36, as described above. Filling the polymer 36 into the cavity 34 can be considered "cavity-based" packaging.

The cavity-based packaging can also be applied to a two-circuit application in some embodiments. For example, two fingerprint sensing circuits 10 can be made using the same upper substrate 12 and lower substrate 14. The upper substrate 12 and the lower substrate 14 can be manufactured as described above, where the lower substrate 14 forms a cavity 34 around at least a portion of the bottom surface 18 of the upper substrate 12. The cavity 34 can be large enough to fit at least portions of two sets of sensing circuitry (e.g., a sensor IC 28 for each, with or without an integral fingerprint image sensor structure and/or an integral fingerprint velocity sensor structure or at least a portion of a separate image sensor structure 24 and velocity sensor structure 26). With the lower substrate 14 and the sensing circuitry formed on or attached to the bottom surface 18, the large cavity 34 can be filled with a polymer 36. Once filled, the two fingerprint sensing circuits contained within the package 10 can be separated by splitting the cavity 34. Such a fingerprint sensing circuit package 10 may be as appears in FIG. 10F. This shared cavity method of manufacturing can reduce package sizes while still imparting adequate strength and durability to the fingerprint sensing circuit packages 10.

In another embodiment, the fingerprint sensing circuit package 10 can have a single-substrate, two-substrate, or multi-substrate architecture, where the image sensor structure 24 and the velocity sensor structure 26 are on a top surface and the sensor IC 28 is on a bottom surface of an upper substrate 12. The image sensor structure 24 and the velocity sensor structure 26 can electrically communicate with the sensor IC 28 through a plurality of electrical vias passing through the upper substrate 12 or the upper and lower substrates 12, 14. For example, each capacitive detector of the image sensor structure 24 and/or the velocity sensor structure 26 can have a separate electrical via leading to the sensor IC 28 for transmission of fingerprint information. To protect the image sensor structure 24 and the velocity sensor structure 26 from physical or electrical damage, an ink layer or an epoxy "glob-top" can be applied to the top surface 16.

In another embodiment, the fingerprint sensing circuit package 10 can include a water seal mechanism. The fingerprint sensing circuit package 10 can have a single-substrate, two-substrate, or multi-substrate architecture, including a top surface and a bottom surface on one substrate or a plurality of substrates together. The outer edge of the substrate 12 or substrates 12, 14, or more substrates, as appropriate, can include a step (i.e., the bottom surface of one substrate has a larger cross-section than the top surface of the adjoining substrate). An o-ring (not shown) can be placed over the step and a rubber seal (not shown) can be placed over the o-ring. The rubber seal and o-ring can substantially protect the underside of the fingerprint sensing circuit package 10 from water. For example, the fingerprint sensing circuit package 10 can be positioned inside a product casing such that the top surface 16 and an inside edge of the rubber seal is exposed. An outer edge of the rubber seal can come in contact with the product casing to prevent water from penetrating around the rubber seal. The o-ring can prevent any water from penetrating between the top surface 16 and the rubber seal.

Figure 8:
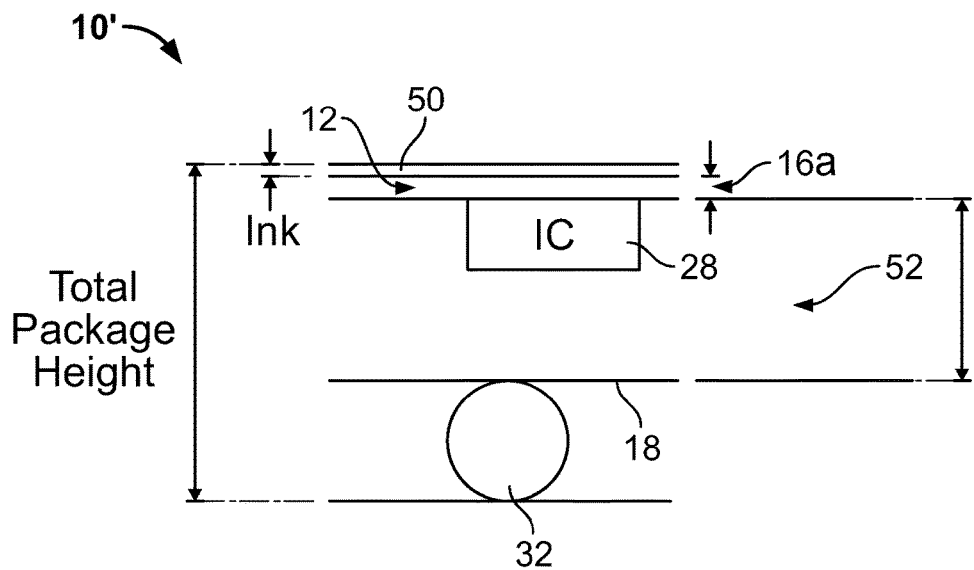
FIG. 8 illustrates schematically an embodiment of a type of package for a fingerprint sensor circuit device according to aspects of the disclosed subject matter.

FIG. 8 illustrates schematically a type of packaging 10' for a fingerprint sensor circuitry device according to aspects of the disclosed subject matter. The package 10' may once again employ ball grid array ("BGA") connections with solder balls 32. The package 10' may, e.g., have a ball pitch, between adjacent solder balls 32 of 0.65 mm or less. The fingerprint image sensor structure and velocity sensor structure, if applicable, should be within 70 μm of the finger contact surface, i.e., the fingerprint sensing side of the package 10'.

The fingerprint sensor circuitry package 10' of FIG. 8 is illustrated to have a top substrate 12 having a top surface 16a, with the substrate 12 having a thickness of about 30 μm. The fingerprint sensor structure 24 can be formed in a metal layer 16a, covered with a layer 50 of ink, which can meet the requirements for the ink top coating 50 of 6H scratch resistance, planarity to ±5 μm, thickness to X±5 μm, with X equaling, e.g., around 20 μm, uniformity in ink color, no structures be visible below the ink layer 50 with normal room lighting at angles of 90 degrees and 45 degrees. The ink layer 50 should also meet the requirements that the texture is uniform across the sensing surface of the device package 10', and consistent from lot to lot with no detectable visual delta. The finger contact surface, outer surface of the ink layer 50, should also have no detectable "edges" or "burrs" following a saw process for separating individual circuit package 10' substrates from an array of such substrates manufactured to together. A swiped finger as part of the finger print sensor operation should not be able to detect any surface defects during swiping.

The finger print sensor structure 24 can be formed in the metal layer 16a on the top side 16 of the upper substrate 12. Due to this, the upper substrate 12 can require multiple vias 56 (shown, e.g., in FIGS. 9A and 9B) to allow the imaging signals to be routed from the IC to the top metal layer 16a and back. The top metal layer 16a can be coated with, e.g., a thin dielectric protective material, such as strontium, and then coated with the ink layer 50.

As shown in FIG. 8, the IC 28 can be attached to the bottom surface 18 of the substrate 12 and, in lieu of a lower substrate 14, the IC 28 may be encased in a layer of supporting and protecting material, such as "pre-preg" 52, such as having a thickness of about 1 mm. Pre-preg is a term for "pre-impregnated" composite fibres. These usually take the form of a weave but can be uni-directional. The fibres can already contain an amount of the matrix material used to bond them together and to other components during manufacture.

Figure 9A:
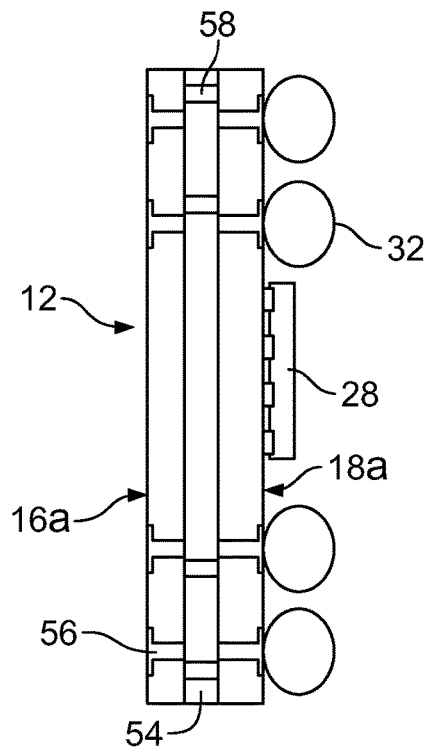
FIG. 9A illustrates a cross sectional view of a fingerprint sensor circuit package according to aspects of an embodiment of the disclosed subject matter.

FIG. 9A shows schematically a cross sectional side view of a fingerprint sensor circuit package 10 according to aspects of an embodiment of the disclosed subject matter. FIG. 9A illustrates a single substrate package having a substrate 12, with a top surface metal layer 16a in which the fingerprint sensor circuit sensing structure 24 and/or the fingerprint velocity sensor structure 26 can be formed, and protected by the overcoating of layer 16b (not shown), which could also be the ink layer 50 of FIG. 8. Vias 56 through the substrate 12 may connect ball grid array solder balls 32 on the bottom side of substrate 12 to, e.g., power leads (not shown) in the metal layer 16a. A buried layer 54 may also have buried vias 58, e.g., for ground connections.

The substrate 12 may also have a bottom layer 18a of metal, formed into leads and connectors (not shown) to which the sensor circuit IC 28 may be attached, by suitable means, as noted above by way of example. The ball grid array solder balls 32 may serve to connect the substrate 12 to a device in an IC device package which will use the fingerprint image created by the fingerprint sensor circuit contained in the fingerprint sensor circuit package 10, i.e., on substrate 12, or to a lower substrate 14 as discussed above.

Figure 9B:
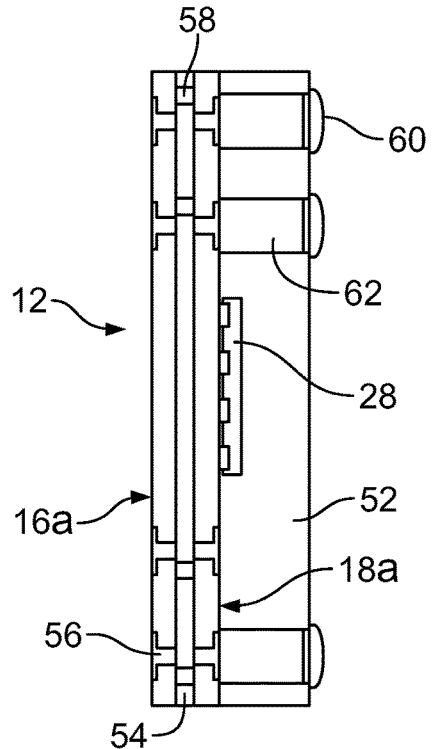
FIG. 9B illustrates a cross sectional view of a fingerprint sensor circuit package according to aspects of an embodiment of the disclosed subject matter.

In a alternate embodiment illustrated in FIG. 9B the IC 28 may be encased in a protective material, such as a pre-preg layer 52. Studs 62 may extent through the pre-preg layer 52 to stud contacts 60, which may, as noted above, serve to connect the substrate 12 to a device using the output of the fingerprint sensor circuitry contained in the package 10, including the substrate 12 or to a lower substrate 14 (not shown in FIG. 9A or 9B).

Figure 10A:
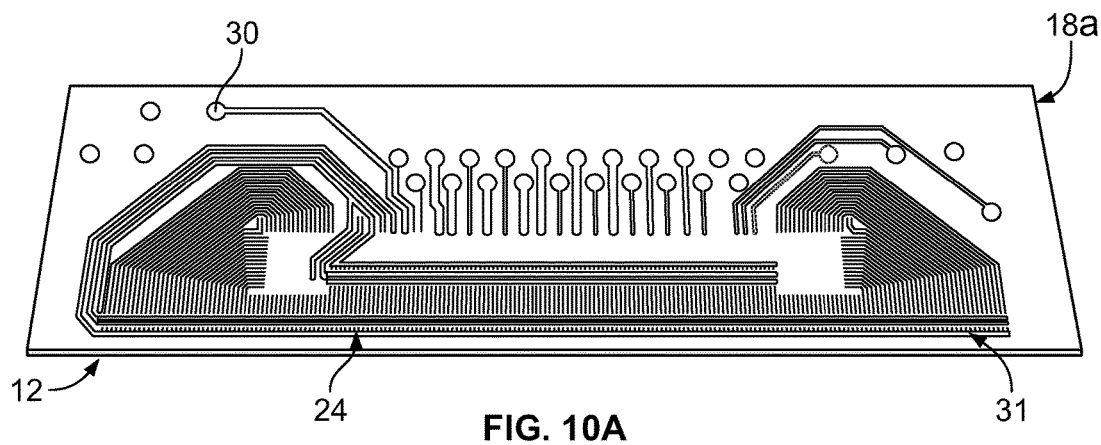
FIGS. 10A-10F illustrate, in isometric view, the assembly and manufacture of a fingerprint sensor circuit package according to aspects of an embodiment of the disclosed subject matter.
Figure 10B:
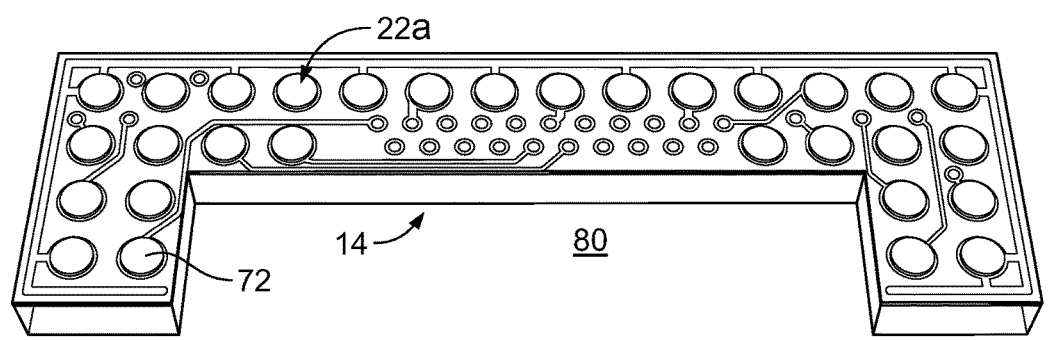
Figure 10C:
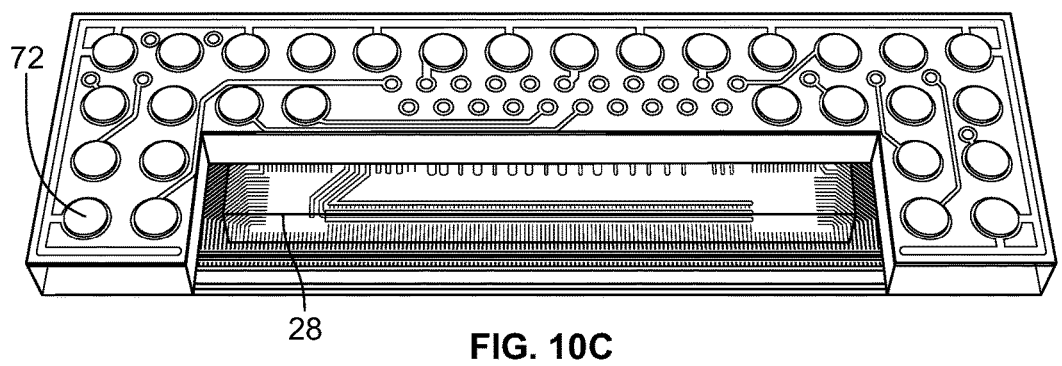
Figure 10D:
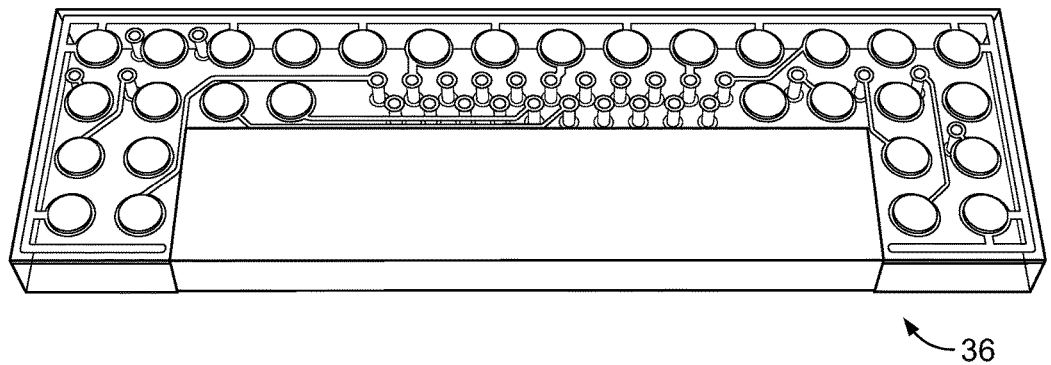
Figure 10E:
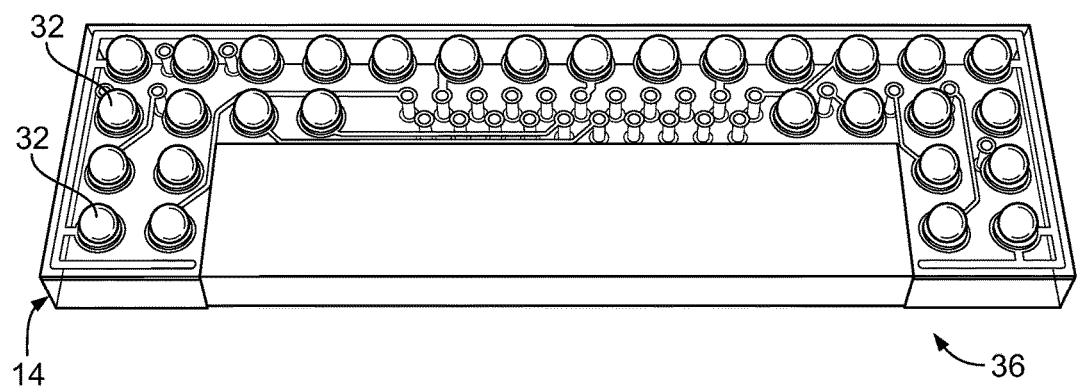
Figure 10F:
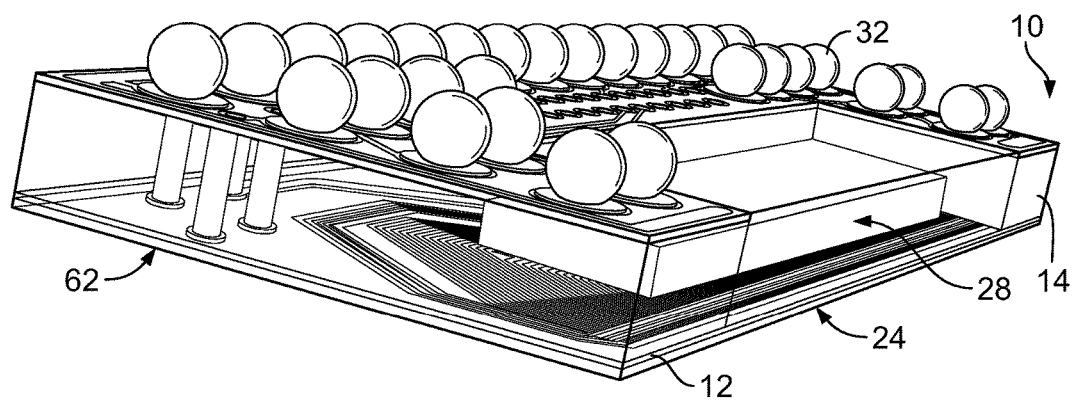

FIGS. 10A-10F show an isometric view of a fingerprint sensor circuit package 10 in various stages of assembly and manufacture. FIG. 10A illustrates the bottom side 18a of an upper substrate 12, having fingerprint sensing structure 24 and associated contacts 30 and leads 31 formed in the metal layer 18a. A lower substrate 14 having a bottom side metal layer 22a, in which are formed, e.g., metal contact pads 72, is illustrated in FIG. 10B. The lower substrate 14 is shown in FIG. 10C in place over the bottom layer 18a of the upper substrate 12, with a portion of the bottom layer 18a exposed by a cut-out 80 in the lower substrate 14. The exposed portion of the bottom metal layer 18a and the fingerprint sensing structure 24 includes contact points for the IC 28 to be attached to the bottom metal layer 18a of the upper substrate 12, as illustrated in FIG. 10C.

FIG. 10d illustrates filling the cut-out 80 of the lower substrate 14 with a protective material, such as epoxy to seal in the IC 28 and the exposed leads of the fingerprint sensing structure 24 in the cut-out as shown in FIG. 10C. After the cut-out 80 is filled, ball grid array solder balls 32 may be placed on the contact pads 72 as shown in FIG. 10E. FIG. 10 F shows a side perspective view of the assembled fingerprint sensor circuit package 10, with the lower substrate 14 partly transparent, showing studs 62, IC 28 and fingerprint sensor structure 24 within and underneath the lower substrate 14.

Figure 11:
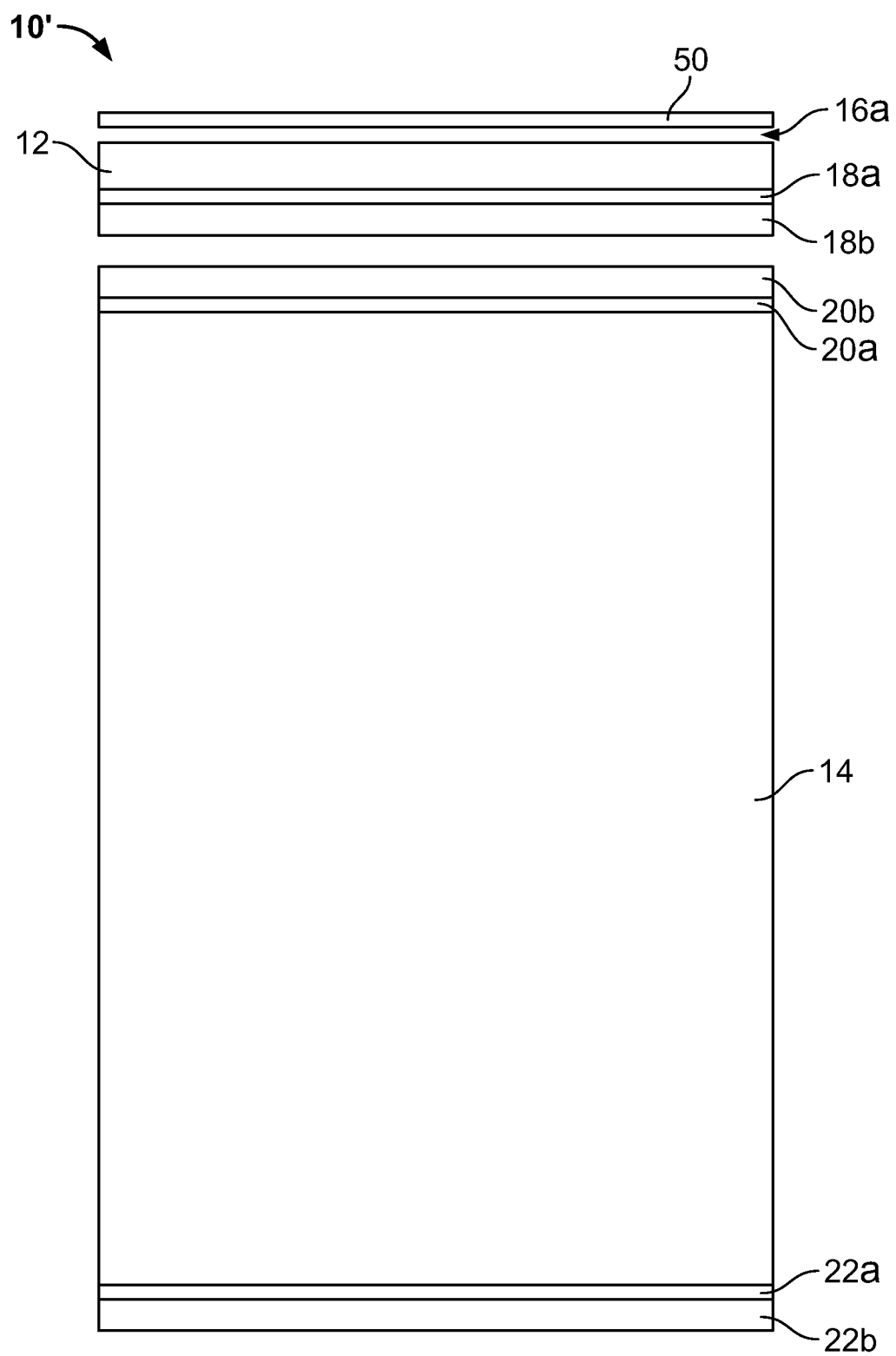
FIG. 11 shows a side view of a fingerprint sensor circuit package according to aspects of an embodiment of the disclosed subject matter.

FIG. 11 illustrates schematically a side view of a fingerprint sensor circuit package 10 such as is illustrated in FIG. 8. The upper substrate 12 has a top layer 16a of metal, in which can be formed the contacts 30 and leads 31 of the fingerprint sensing structure 24, and may be covered with a layer of ink 50. The upper substrate 12 may be attached to the lower substrate 14 as discussed above.

Figure 12A:
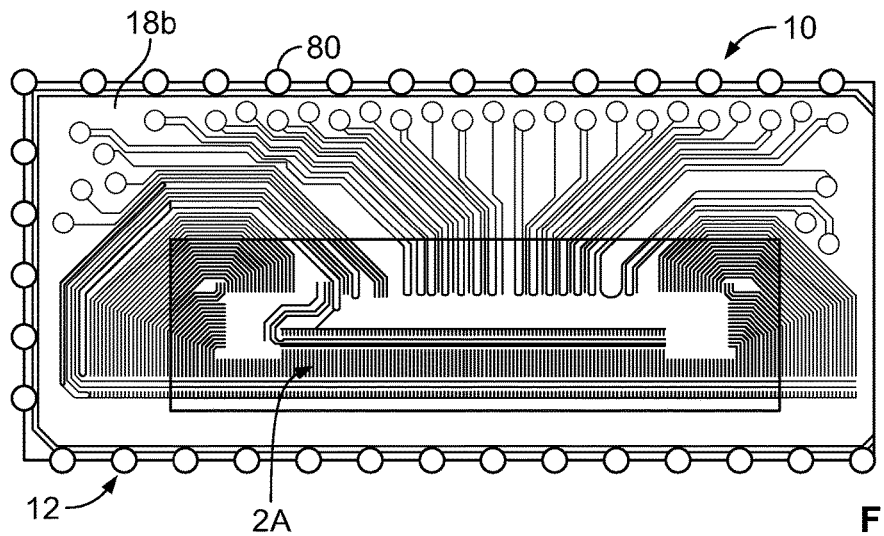
FIGS. 12A-12F illustrate at top view of the assembly and manufacture of a fingerprint sensor circuit package according to aspects of an embodiment of the disclosed subject matter.

FIGS. 12A-12F show a bottom plan view of an embodiment of a fingerprint sensor circuit package 10 according to aspects of an embodiment of the disclosed subject matter in various stages of assembly and manufacture. FIG. 12A shows a bottom metal layer 18a on an upper substrate 12, having fingerprint sensing circuit structure 24 formed in the metal of metal layer 18a. Castellations 80, which will form an ESD protection barrier for the package 10 are formed on the periphery of substrate 12. The opposite top side 16 of substrate 12 (not shown) has been lapped to a thickness of about 30 μm and coated with a layer of ink of about 8 μm in thickness.

Figure 12B:
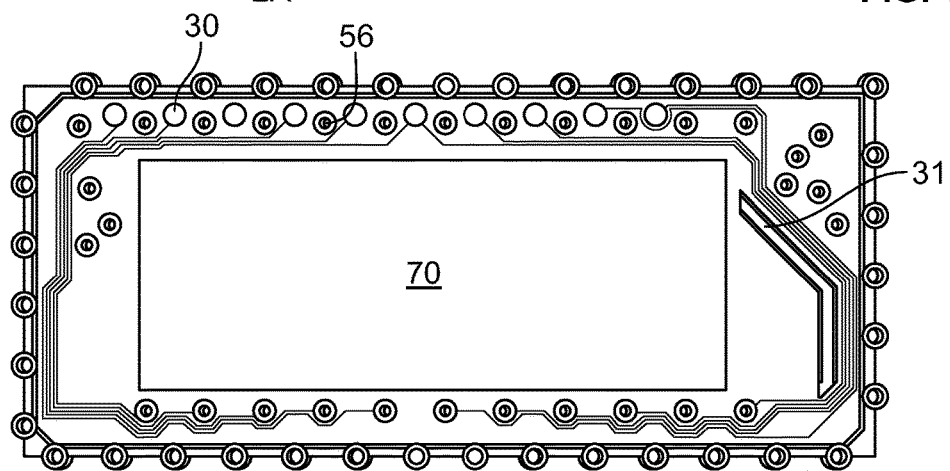
Figure 12C:
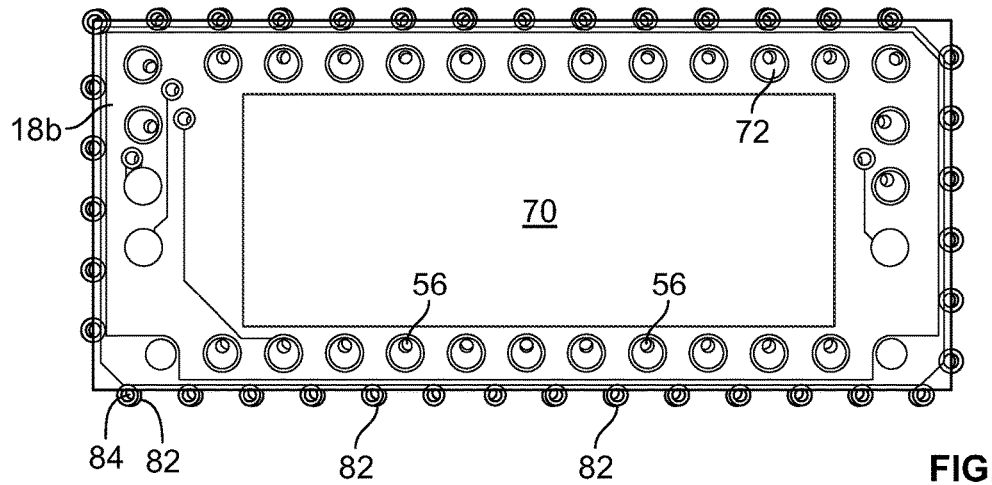
Figure 12D:
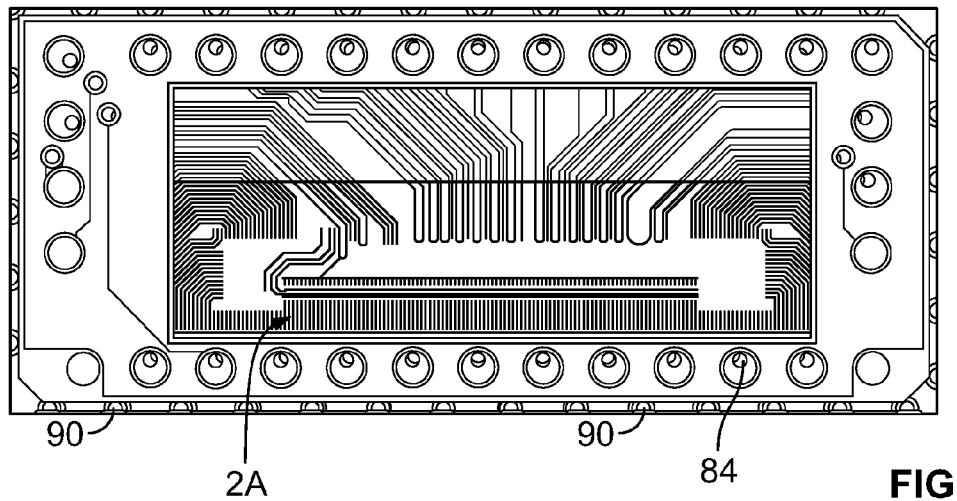
Figure 12E:
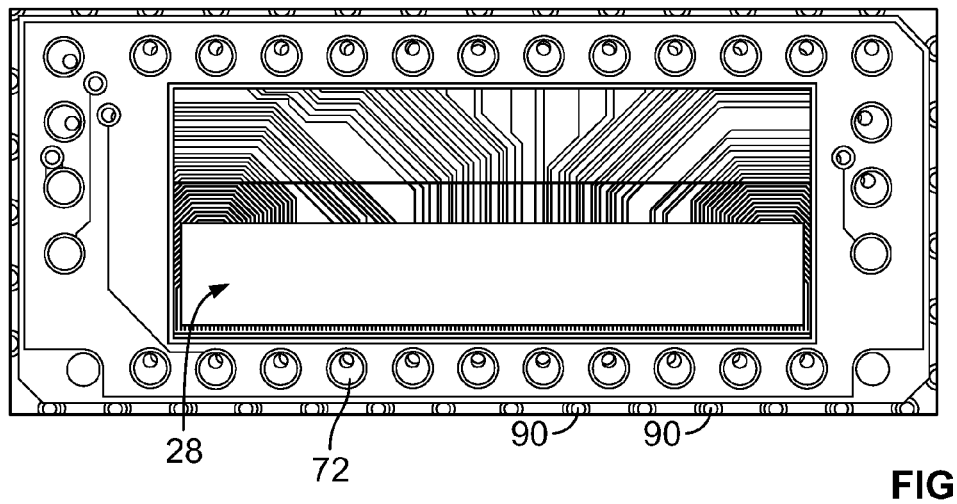
Figure 12F:
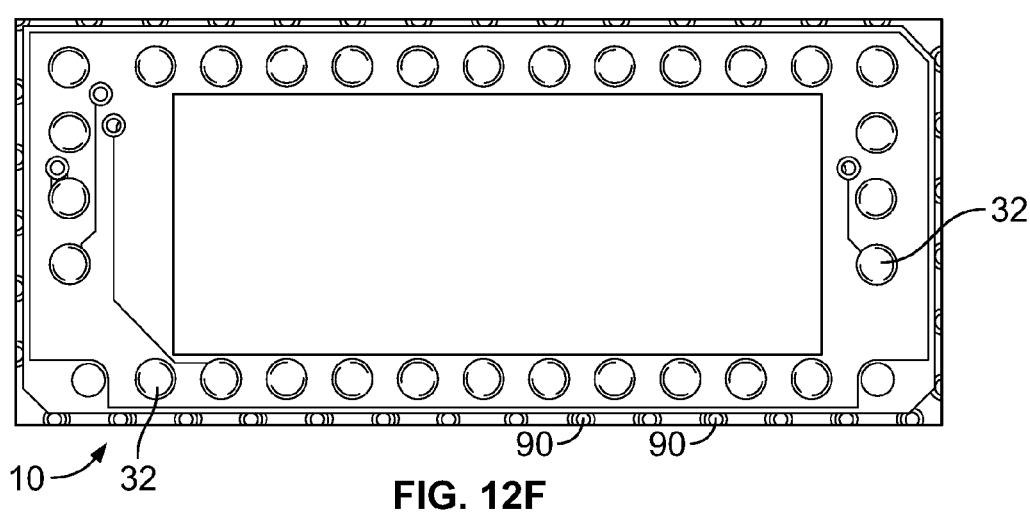

FIG. 12B shows a top plan view of a lower substrate 14. The lower substrate 14 is about 5 mm in thickness and has contacts 30, leads 31 and vias 56 formed in the substrate 14. The substrate 14 also has a window opening 70. FIG. 12C shows a bottom plan view of the substrate 14, showing the vias 56 and castellations 80 having holes 84 drilled through the castellations 80 on the periphery of the package 10. FIG. 12D shows a bottom plan view of the substrate 12 and 14 assembled together with a portion of the fingerprint sensing structure 24 showing through the opening window 70. As shown also in FIG. 12A, part of the metal layer 18a is coated with a protective coating 18b in the area exposed in the window opening 70. As shown in FIG. 12E, the IC 28 can be attached to the exposed contacts in the metal layer 18a of the bottom side of the upper substrate 12, e.g., by eutectic attachment, e.g., with Au bumps. FIG. 12E also illustrates the configuration of a package 10 when cut from a laminated structure containing a plurality of packages 10, such that the castellations 80 are cut in half to form semi-circular ESD protection castellations 90. FIG. 12F shows the package 10 with grid ball array solder balls 32 formed on the solder ball contact pads 72 of the bottom side 22b of the lower substrate 14. FIG. 12F also shows the opening 70 filled with a protective material, such as epoxy.

In one embodiment a method of making a fingerprint sensing circuit package can comprise forming a first substrate having a top side and a bottom side, the top side of the first substrate comprising a fingerprint image sensing side over which a user's fingerprint is swiped and the bottom side of the first substrate comprising a metal layer forming a fingerprint sensing circuit image sensor structure; and mounting a sensor control circuit housed in a sensor control circuit package on the metal layer.

In another embodiment, a method of making a fingerprint sensing circuit package can comprise forming a first substrate having a top side and a bottom side, the top side of the first substrate comprising a fingerprint image sensing side over which a user's fingerprint is swiped; and the bottom side of the first substrate comprising a metal layer forming a fingerprint sensing circuit image sensor structure. Mounting a sensor control circuit housed in a sensor control circuit package on the metal layer. Forming a second substrate attached to the bottom side of the first substrate having a bottom side of the second substrate on which is placed connector members connecting the fingerprint sensing circuit package to a device using a fingerprint image generated from the fingerprint sensing circuitry contained in the fingerprint sensing circuit package. The second substrate being formed with a cutout area over the sensor control circuit package, a sensor control circuit protective material covering the sensor control circuit in the cutout area.

In another embodiment the method of making a fingerprint sensing circuit package can comprise forming a first substrate having a top side and a bottom side, the top side of the first substrate comprising a fingerprint image sensing side over which a user's fingerprint is swiped and the bottom side of the first substrate comprising a metal layer forming a fingerprint sensing circuit image sensor structure. A sensor control circuit housed in a sensor control circuit package can be mounted on the metal layer. The method may also include forming a second substrate attached to the bottom side of the first substrate having a bottom side of the second substrate on which is placed connector members connecting the fingerprint sensing circuit package to a device using a fingerprint image generated from the fingerprint sensing circuitry contained in the fingerprint sensing circuit package and the second substrate can comprise an opening spaced over and surrounding the sensor control circuit package, with a sensor control circuit protective material covering the sensor control circuit in the opening.

In another embodiment, a method of using a fingerprint imaging sensor circuit package may comprise utilizing a first substrate having a top side and a bottom side, with the top side of the first substrate comprising a fingerprint image sensing side over which a user's fingerprint is swiped and the bottom side comprising a metal layer forming a fingerprint sensing circuit image sensor structure. Employing a sensor control circuit housed in a sensor control circuit package mounted on the metal layer. A second substrate can be utilized, attached to the bottom side of the first substrate, which has a bottom side of the second substrate on which can be placed connector members utilized to connect the fingerprint sensing circuit package to a device using a fingerprint image generated from the fingerprint sensing circuitry contained in the fingerprint sensing circuit package. A cutout section of the second substrate over the sensor control circuit package can be utilized to contain a sensor control circuit protective material covering the sensor control circuit in the cutout area.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A fingerprint sensing system comprising:
   a flexible first substrate having a top side and a bottom side, the flexible first substrate formed of an insulating material;
   a metal layer formed on the bottom side of the flexible first substrate, the metal layer formed to comprise a fingerprint sensing system image sensor structure;
   the top side of the flexible first substrate comprising a fingerprint image sensing side over which a fingerprint of a user is swiped, whereby the first flexible substrate insulates the finger of the user from the fingerprint sensing system image sensor structure;
   a system controller integrated circuit housed in a system controller integrated circuit package mounted on the metal layer remotely positioned from the fingerprint sensing system image sensor structure;

a second substrate attached to the bottom side of the flexible first substrate having a second substrate bottom side including connector members connecting the fingerprint sensing system to a device that utilizes an output of the fingerprint sensing system controller integrated circuit;

wherein the connector members comprise metal contact pads connected to the bottom side of the flexible first substrate through metal contact pads on a top side of the second substrate and intermediate connector studs, wherein the intermediate connector studs pass through the second substrate from the top side of the second substrate to the bottom side of the second substrate;

wherein the second substrate comprises a cavity in which the system controller integrated circuit package is disposed, and wherein the cavity is filled with polymer filler.

2. The fingerprint sensing system of claim 1 further comprising:
the first substrate having a thickness determined by back-lapping the first substrate on the top side of the first substrate.

3. The fingerprint sensing system of claim 1 further comprising:
the top side of the first substrate covered with a protective layer of ink.

4. A fingerprint sensing system comprising:
a flexible first substrate having a top side and a bottom side, the flexible first substrate formed of an insulating material;
a metal layer formed on the bottom side of the flexible first substrate, the metal layer formed to comprise a fingerprint sensing system image sensor structure;
the top side of the flexible first substrate comprising a fingerprint image sensing side over which a fingerprint of a user is swiped, whereby the flexible first substrate insulates the finger of the user from the fingerprint sensing system image sensor structure;
a sensor controller integrated circuit housed in a sensor controller integrated circuit package mounted on the metal layer remotely positioned from the fingerprint sensing system image sensor structure;
a second substrate attached to the bottom side of the flexible first substrate having a bottom side of the second substrate including connector members connecting the fingerprint sensing system to a device using a fingerprint image generated from the fingerprint sensing system;
wherein the connector members comprise metal contact pads connected to the bottom side of the flexible first substrate through metal contact pads on a top side of the second substrate and intermediate connector studs, wherein the intermediate connector studs pass through the second substrate from the top side of the second substrate to the bottom side of the second substrate; and
the second substrate comprising a cutout section therein over the sensor controller integrated circuit package, and sensor controller integrated circuit package the protective material disposed in the cutout section that covers the sensor controller integrated circuit package.

5. The fingerprint sensing system of claim 4 wherein the sensor controller integrated circuit package protective material comprises pre-preg.

6. The fingerprint sensing system of claim 4 further comprising:
the top side covered with a protective layer of ink.

7. A fingerprint sensing system package comprising:
a flexible first substrate having a top side and a bottom side;
a metal layer formed on the bottom side of the flexible first substrate, the metal layer formed to comprise a fingerprint sensing system image sensor structure;
the top side of the flexible first substrate comprising a fingerprint image sensing side over which a fingerprint of a user is swiped, whereby the flexible first substrate insulates the finger of the user from the fingerprint sensing system image sensor structure;
a sensor controller integrated circuit housed in a sensor controller integrated circuit package mounted on the metal layer;
a second substrate attached to the bottom side of the flexible first substrate having a bottom side of the second substrate including connector members connecting the fingerprint sensing system package to a device using a fingerprint image generated from the fingerprint sensor controller integrated circuit contained in the fingerprint sensor controller integrated circuit package;
wherein the connector members comprise metal contact pads connected to the bottom side of the flexible first substrate through metal contact pads on a top side of the second substrate and intermediate connector studs, wherein the intermediate connector studs pass through the second substrate from the top side of the second substrate to the bottom side of the second substrate; and
the second substrate comprising an opening spaced over and surrounding the sensor controller integrated circuit package, a sensor controller integrated circuit protective material disposed in the opening that covers the sensor controller integrated circuit.

8. The fingerprint sensing system package of claim 1 further comprising:
the metal layer having portions removed to form conductive traces of the fingerprint image sensing system image sensor structure.

9. A fingerprint sensing system package comprising:
a flexible first substrate having a top side and a bottom side;
a metal layer formed on the bottom side of the flexible first substrate, the metal layer formed to comprise a fingerprint sensing system image sensor structure;
the top side of the flexible first substrate comprising a fingerprint image sensing side over which a fingerprint of a user is swiped, whereby the flexible first substrate insulates the finger of the user from the fingerprint sensing system image sensor structure;
a second substrate attached to the bottom side of the flexible first substrate having a second substrate bottom side including connector members connecting the fingerprint sensing system to a device that utilizes an output of the fingerprint sensing system controller integrated circuit;
wherein the connector members comprise metal contact pads connected to the bottom side of the flexible first substrate through metal contact pads on a top side of the second substrate and intermediate connector studs, wherein the intermediate connector studs pass through the second substrate from the top side of the second substrate to the bottom side of the second substrate; and
a sensor controller integrated circuit housed in a sensor controller integrated circuit package mounted on the metal layer;

wherein the second substrate comprises a cavity in which the sensor controller integrated circuit package is disposed, and wherein the cavity is filled with polymer filler.

10. The system of claim 1 wherein the connector members comprise a ball grid array.

11. The system of claim 7 wherein the connector members comprise a ball grid array.

12. The fingerprint sensing system package of claim 9 further comprising:
   the sensor controller integrated circuit comprising an integrated circuit die contained within the sensor controller integrated circuit package.

13. The fingerprint sensing system package of claim 9 further comprising:
   the top side of the flexible first substrate is covered with a protective layer of ink.

14. The system of claim 1 wherein the polymer filler comprises epoxy.

15. The system of claim 7 wherein the sensor controller integrated circuit protective material comprises pre-preg.

16. The fingerprint sensing system package of claim 9 wherein the polymer filler comprises epoxy.

* * * * *

UNITED STATES PATENT AND TRADEMARK OFFICE
CERTIFICATE OF CORRECTION

PATENT NO. : 9,666,635 B2
APPLICATION NO. : 13/031557
DATED : May 30, 2017
INVENTOR(S) : Erhart et al.

Page 1 of 1

It is certified that error appears in the above-identified patent and that said Letters Patent is hereby corrected as shown below:

In the Claims

Column 13, Line 59, delete the word "the".

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*